(12) United States Patent
Jeong et al.

(10) Patent No.: US 8,445,317 B2
(45) Date of Patent: May 21, 2013

(54) METHODS OF FABRICATING SEMICONDUCTOR DEVICES

(75) Inventors: Jin Ha Jeong, Yongin-si (KR); Jung-Ho Kim, Suwon-si (KR); Kihyun Hwang, Seongnam-si (KR); Yong-Hoon Son, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 89 days.

(21) Appl. No.: 13/030,454

(22) Filed: Feb. 18, 2011

(65) Prior Publication Data

US 2011/0207303 A1 Aug. 25, 2011

(30) Foreign Application Priority Data

Feb. 19, 2010 (KR) .................. 10-2010-0015314
Oct. 4, 2010 (KR) .................. 10-2010-0096497

(51) Int. Cl.
*H01L 21/84* (2006.01)

(52) U.S. Cl.
USPC ............................ 438/99; 438/496

(58) Field of Classification Search
USPC ................... 438/151–166, 99, 496
See application file for complete search history.

(56) References Cited

U.S. PATENT DOCUMENTS

| 7,348,224 B2 * | 3/2008 | Yudasaka et al. ............. 438/151 |
| 7,767,547 B2 * | 8/2010 | Isaka et al. .................... 438/458 |
| 2007/0123062 A1 | 5/2007 | Kang et al. |

FOREIGN PATENT DOCUMENTS

| KR | 10-2008-0070583 A | 7/2008 |
| KR | 10-0880377 B1 | 1/2009 |
| KR | 10-2009-0047614 A | 5/2009 |

\* cited by examiner

*Primary Examiner* — Richard Booth
(74) *Attorney, Agent, or Firm* — Myers Bigel Sibley & Sajovec, P.A.

(57) ABSTRACT

Methods for fabricating a semiconductor device are provided. In the methods, first material layers and second material layers may be alternatingly and repeatedly stacked on a substrate. An opening penetrating the first material layers and the second material layers may be formed. A semiconductor solution may be formed in the opening by using a spin-on process.

19 Claims, 28 Drawing Sheets

METHODS OF FABRICATING SEMICONDUCTOR DEVICES

CROSS-REFERENCE TO RELATED APPLICATIONS

This application claims the benefit of Korean Patent Application No. 10-2010-0015314, filed on Feb. 19, 2010, and Korean Patent Application No. 10-2010-0096497, filed on Oct. 4, 2010, and the disclosures of each of these applications are incorporated herein by reference in their entireties.

BACKGROUND

The present disclosure herein relates to methods of fabricating semiconductor devices.

As the electronics industry advances rapidly, the degree of integration of semiconductor devices also increases. The degree of integration of semiconductor devices may act as an important factor in determining product prices. That is, higher integration can decrease semiconductor memory device product prices. Therefore, demand for higher integration of semiconductor memory devices may increase. Because the degree of integration of semiconductor devices may be determined by a planar area occupied by a unit memory cell, it may influence the level of micropattern forming technology. However, the fineness of patterns may be limited by expensive semiconductor equipment and/or difficulties in semiconductor fabricating processes.

SUMMARY

The present disclosure provides methods for fabricating semiconductor devices with excellent reliability.

The present disclosure also provides methods for fabricating semiconductor devices optimized for higher integration.

Some embodiments provide methods for fabricating a semiconductor device. The methods may include stacking first material layers and second material layers on a substrate to form a stack within which the first material layers and the second material layers repeatedly alternate. The methods may also include forming an opening penetrating the first material layers and the second material layers. The methods may further include forming a semiconductor solution in the opening by using a spin-on process. Additionally, the methods may include thermally treating the semiconductor solution.

In some embodiments, the opening may expose a surface of the substrate, and the thermal treatment may change the semiconductor solution to a solid semiconductor layer contacting the surface of the substrate.

In some embodiments, the solid semiconductor layer may be in an amorphous state, and the method may further include crystallizing the solid semiconductor layer.

In some embodiments, crystallizing the solid semiconductor layer may include at least one of irradiating laser beam to the solid semiconductor layer or supplying heat to the solid semiconductor layer, and a process temperature for crystallizing the solid semiconductor layer may be higher than a process temperature for the thermal treatment of the semiconductor solution.

In some embodiments, the methods may further include, before forming the semiconductor solution, forming an auxiliary semiconductor layer at least partially filling the opening.

In some embodiments, a volume occupied by the auxiliary semiconductor layer in the opening may be less than a volume occupied by the semiconductor solution in the opening.

In some embodiments, the semiconductor solution may be changed to a solid semiconductor layer by the thermal treatment, the solid semiconductor layer and the auxiliary semiconductor layer may be in an amorphous state, and the method may further include, after the thermal treatment of the semiconductor solution, crystallizing the auxiliary semiconductor layer and the solid semiconductor layer.

In some embodiments, the auxiliary semiconductor layer may be conformally formed along a sidewall of the opening and a portion of the opening that is adjacent a surface of the substrate, and the auxiliary semiconductor layer may have a thickness which is less than half of a width of the opening.

In some embodiments, forming the auxiliary semiconductor layer may include: forming a preliminary auxiliary semiconductor layer in the opening such that the preliminary auxiliary semiconductor layer has a thickness which is equal to or greater than half of a width of the opening; and recessing the preliminary auxiliary semiconductor layer to form the auxiliary semiconductor layer such that the auxiliary semiconductor layer only partially fills the opening.

In some embodiments, a portion of the preliminary auxiliary semiconductor layer may include a void.

In some embodiments, the auxiliary semiconductor layer may be free of the void.

In some embodiments, the methods may include, after the thermal treatment of the semiconductor solution, forming a trench exposing sidewalls of the first and second material layers, removing the first material layers to form recess regions, forming an information storage layer in each of the recess regions, and forming gates filling the recess regions.

In some embodiments, the first material layers may include a conductive material, and the second material layers may include an insulating material.

In some embodiments, the methods may include, before forming the semiconductor solution, forming an information storage layer in the opening.

In some embodiments, the semiconductor solution may include cyclopentasilane and toluene.

In some embodiments, forming the semiconductor solution may include filling the opening with the semiconductor solution such that the semiconductor solution covers the first material layers and covers an uppermost one of the second material layers that covers the first material layers.

In some embodiments, the thermal treatment may change the semiconductor solution filling the opening and covering the uppermost material layer to a solid semiconductor layer, and the methods may further include, after the thermal treatment of the semiconductor solution, planarizing the solid semiconductor layer using the uppermost material layer as an etch stop layer to expose a surface of the uppermost material layer and confine the solid semiconductor layer to the opening.

In some embodiments, the first material layers are formed on a buffer dielectric layer such that the buffer dielectric layer is between the first material layers and the substrate.

In some embodiments, the methods may further include, before forming the semiconductor solution, forming a spacer in the opening.

BRIEF DESCRIPTION OF THE DRAWINGS

The foregoing and other features and advantages of the disclosure will become more apparent by describing in detail exemplary embodiments thereof with reference to the following drawings.

DETAILED DESCRIPTION OF EXAMPLE EMBODIMENTS

Figure 1A:
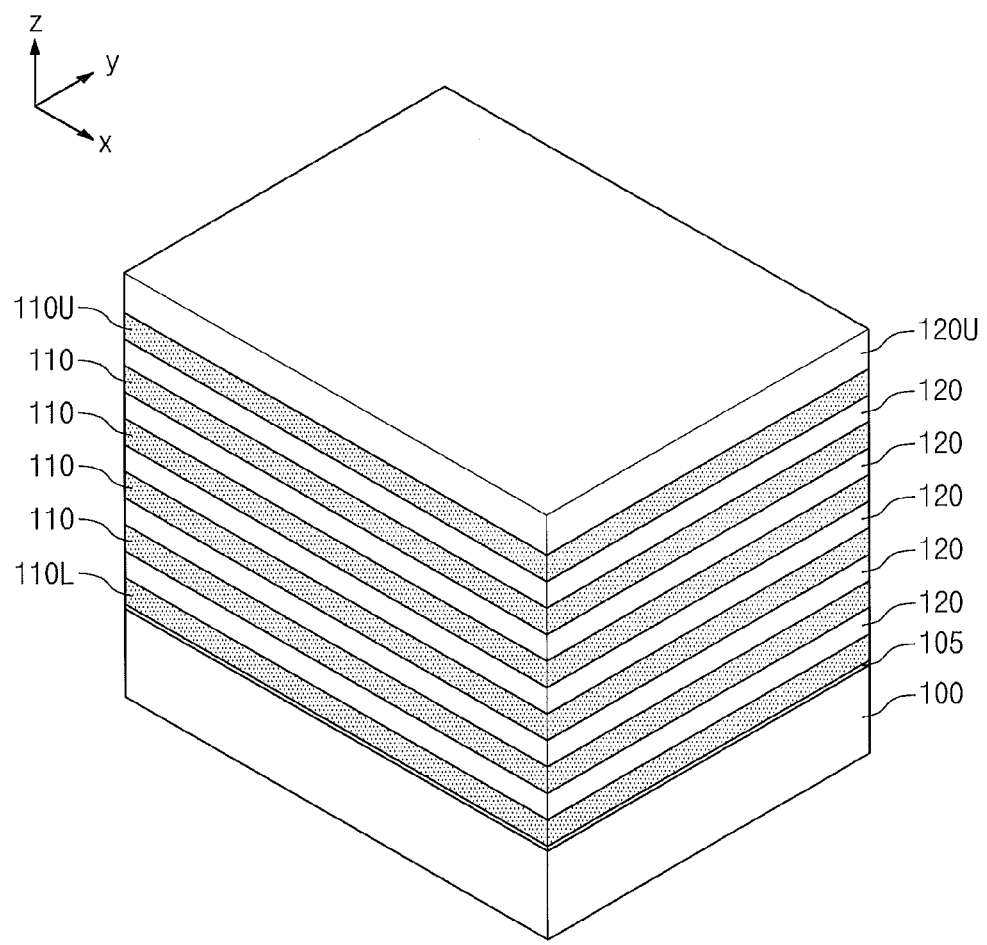
FIGS. 1A through 1I are perspective views for illustrating a method for fabricating a semiconductor device according to some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a", "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, methods for fabricating semiconductor devices according to some embodiments will be described in detail with the accompanying drawings. FIGS. 1A through 1I are perspective views for illustrating a method for fabricating a semiconductor device according to some embodiments.

Referring to FIG. 1A, a substrate 100 may be prepared. The substrate 100 may be a semiconductor substrate. For example, the substrate 100 may be a silicon substrate, a germanium substrate, a silicon-germanium substrate, a compound semiconductor substrate, or the like. The substrate 100 may be doped with a first type of dopants, such as p-type or n-type dopants.

First material layers and second material layers, where the second material layers may include a different material from a material(s) constituting the first material layers, may be alternatingly and repeatedly stacked on the substrate 100. The first material layers may be sacrificial layers 110L, 110, and 110U. The second material layers may be insulating layers 120 and 120U. The sacrificial layers 110L, 110, and 110U may include a material having an etch selectivity with respect to the insulating layers 120 and 120U. For example, the insulating layers 120 and 120U may include an oxide, and the sacrificial layers 110L, 110, and 110U may include a nitride and/or an oxynitride. The sacrificial layers 110L, 110, and 110U may include the same material. Likewise, the insulating layers 120 and 120U may include the same material.

The sacrificial layers 110L, 110, and 110U may be formed to have the same thickness. Alternatively, the lowermost sacrificial layer 110L and the uppermost sacrificial layer 110U may be thicker than the sacrificial layers 110 between the lowermost sacrificial layer 110L and the uppermost sacrificial layer 110U. The sacrificial layers 110 between the lowermost sacrificial layer 110L and the uppermost sacrificial layer 110U may be formed to have the same thickness, even though the lowermost sacrificial layer 110L and the uppermost sacrificial layer 110U may be thicker. Among the insulating layers 120 and 120U, the uppermost insulating layer 120U may be thicker than the underlying insulating layers 120. The insulating layers 120 underlying the uppermost insulating layer 120U may be formed to have the same thickness.

Before forming the sacrificial layers 110L, 110, and 110U and the insulating layers 120 and 120U, a buffer dielectric layer 105 may be further formed on the substrate 100. The sacrificial layers 110L, 110, and 110U and the insulating layers 120 and 120U may be formed on the buffer dielectric layer 105. The lowermost sacrificial layer 110L may be formed directly on the buffer dielectric layer 105. The buffer dielectric layer 105 may include a dielectric material having an etch selectivity with respect to the sacrificial layers 110L, 110, and 110U. For example, the buffer dielectric layer 105 may include an oxide layer, such as a thermal oxide layer.

Figure 1B:
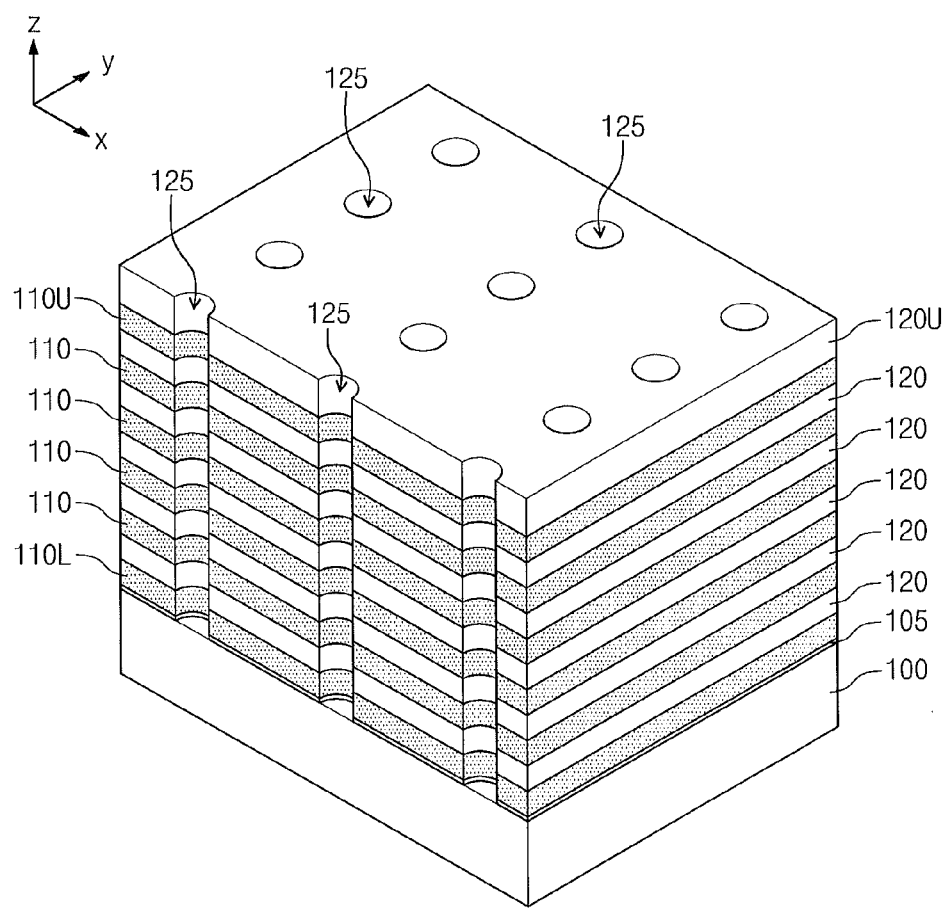

Referring to FIG. 1B, the buffer dielectric layer 105, the insulating layers 120U and 120, and the sacrificial layers 110U, 110 and 110L may be successively patterned to form channel openings 125 exposing a top surface of the substrate 100. For example, the top surface of the substrate 100 may be directly adjacent the buffer dielectric layer 105, and patterning the buffer dielectric layer 105 to form the channel openings 125 may remove portions of the buffer dielectric layer 105 directly adjacent the substrate 100. The channel openings 125 may be formed by using an anisotropic etch process. The channel openings 125 may have a hole shape, and the hole shape may be substantially uniform through the buffer dielectric layer 105, the insulating layers 120U and 120, and the sacrificial layers 110U, 110 and 110L. The channel openings 125 may be spaced apart from one another. The channel openings 125 may be arranged two-dimensionally along a first direction and a second direction perpendicular to the first direction. The first direction and the second direction may be parallel to the top surface of the substrate 100. In the figures, an x-axis direction may correspond to the first direction, and a y-axis direction may correspond to the second direction. The channel openings 125 may include various shapes in plan view, including circular, elliptical, or polygonal.

Figure 1C:
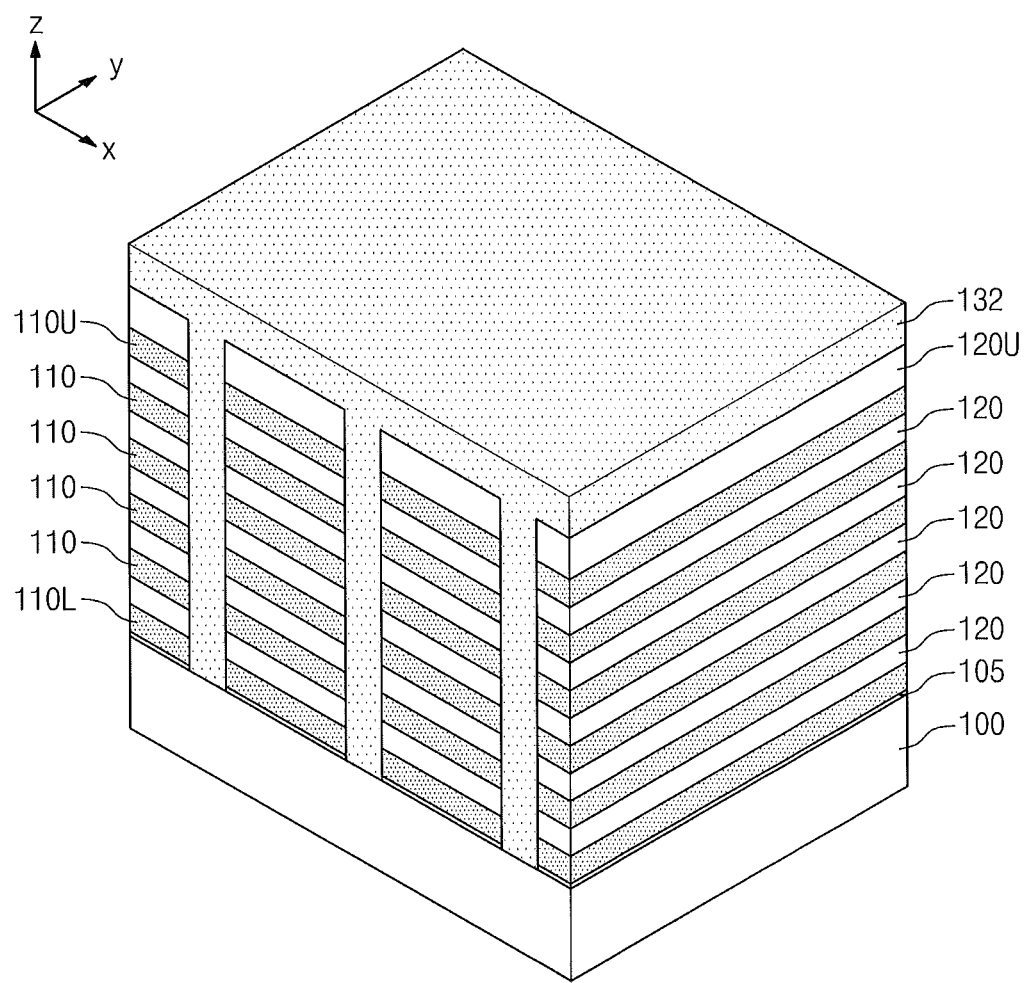

Referring to FIG. 1C, a semiconductor solution 132 may be formed in the channel openings 125. The semiconductor solution 132 may be formed by using a spin-on process. The semiconductor solution 132 may completely fill the channel openings 125. The semiconductor solution 132 may be formed so as to fully cover a top surface of the uppermost insulating layer 120U.

The semiconductor solution 132 may be in a liquid state including a semiconductor material and having a viscosity. For example, the semiconductor solution 132 may be in a state such that a dispersoid including a semiconductor material is dispersed in a liquid dispersion medium. The dispersoid may further include an additional element bonded to the semiconductor material. For example, the semiconductor solution 132 may include cyclopentasilane and toluene. The cyclopentasilane may correspond to a dispersoid including silicon, the toluene may correspond to the dispersion medium, and the hydrogen included in the cyclopentasilane may be the additional element. By forming the semiconductor solution 132 having the viscosity using the spin-on process, the channel openings 125 may be filled by the semiconductor solution 132 without any void or seam.

Figure 1D:
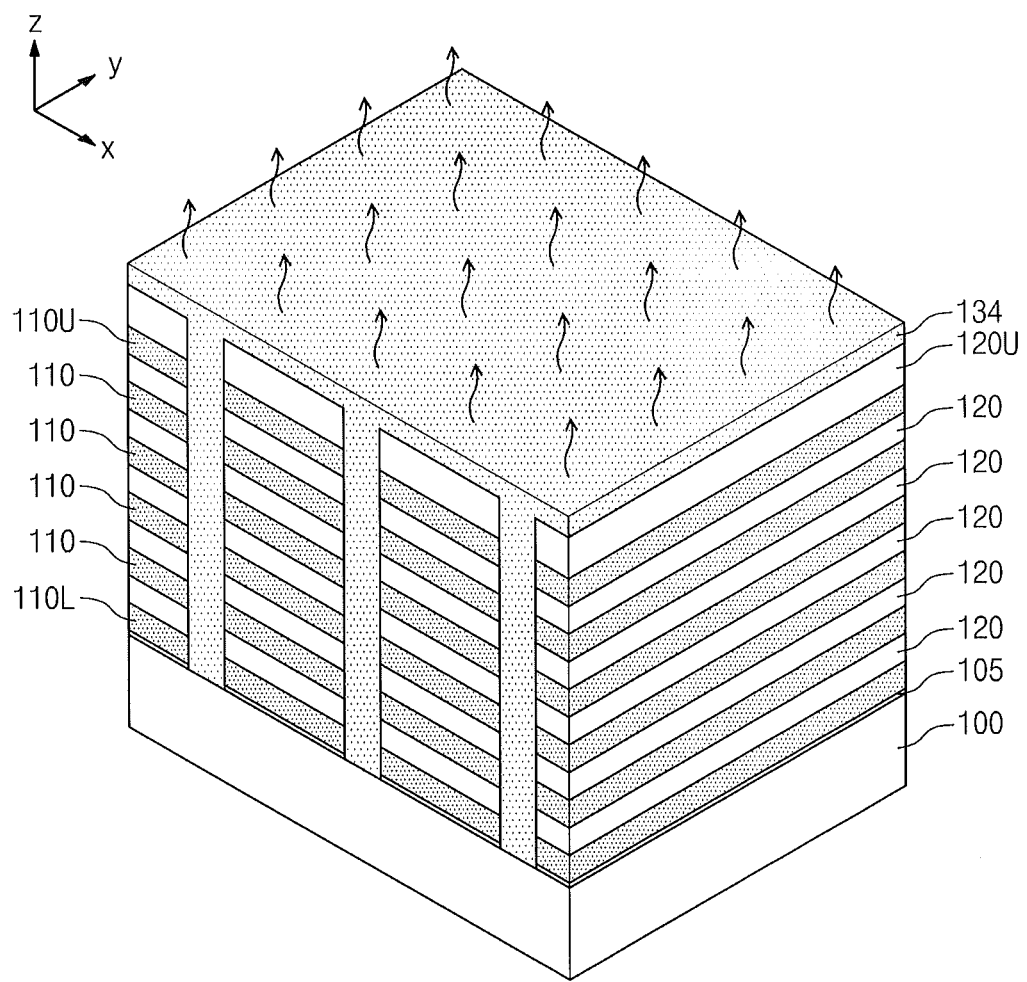

Referring to FIG. 1D, the semiconductor solution 132 may be thermally treated. By the thermal treatment, the semiconductor solution 132 may be changed to a solid semiconductor layer 134. By the thermal treatment, the dispersion media in the semiconductor solution 132 may be vaporized. Additionally, by the thermal treatment, the additional element and the semiconductor material in the dispersoid may be separated from each other. The separated additional element may be vaporized. Resultantly, the semiconductor solution 132 may be changed to the solid semiconductor layer 134.

The semiconductor layer 134 may be in an amorphous state. The solid semiconductor layer 134 may contact the top surface of the substrate 100. In some embodiments, the solid semiconductor layer 134 may directly contact the top surface of the substrate 100. The thermal treatment may include irradiating ultraviolet rays onto the semiconductor solution 132. As the dispersion media are vaporized, a distance from the top surface of the uppermost insulating layer 120U to a top surface of the semiconductor layer 134 may be less than a distance from the top surface of the uppermost insulating layer 120U to the top surface of the semiconductor solution 132. In other words, the thickness of the semiconductor layer 134 on the uppermost insulating layer 120U may be less than the thickness of the semiconductor solution 132 on the uppermost insulating layer 120U.

Figure 1E:
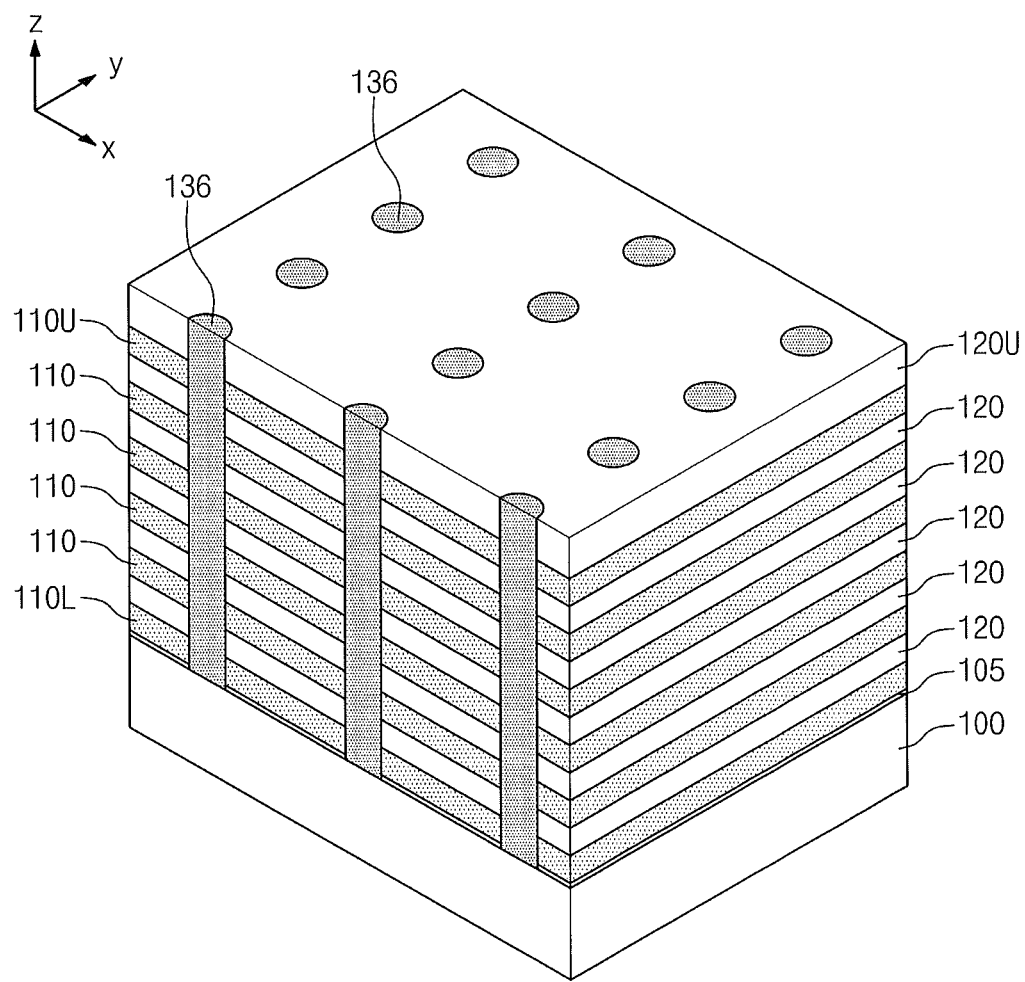

Referring to FIG. 1E, a planarizing process may be performed by using the uppermost insulating layer 120U as an etch stop layer. The planarizing process may be performed by an etch back or chemical mechanical polishing (CMP). By the planarizing process, the semiconductor layer 134 on the uppermost insulating layer 120U may be removed. By doing so, the semiconductor layer 134 may be confined in the channel openings 125.

After the planarizing process, a process for crystallizing the semiconductor layer 134 may be performed. By the crystallizing process, the amorphous semiconductor layer 134 may be changed to a crystalline semiconductor pillar 136. The semiconductor pillar 136 may be in a single crystalline state or polycrystalline state. The semiconductor pillar 136 may contact the top surface of the substrate 100. In some embodiments, the semiconductor pillar 136 may directly contact the top surface of the substrate 100. Crystallizing the semiconductor layer 134 may include at least one of irradiating a laser beam to the semiconductor layer 134, or supplying heat to the semiconductor layer 134. The crystallizing process may have a process temperature which is higher than the process temperature of the thermal treatment.

Figure 1F:
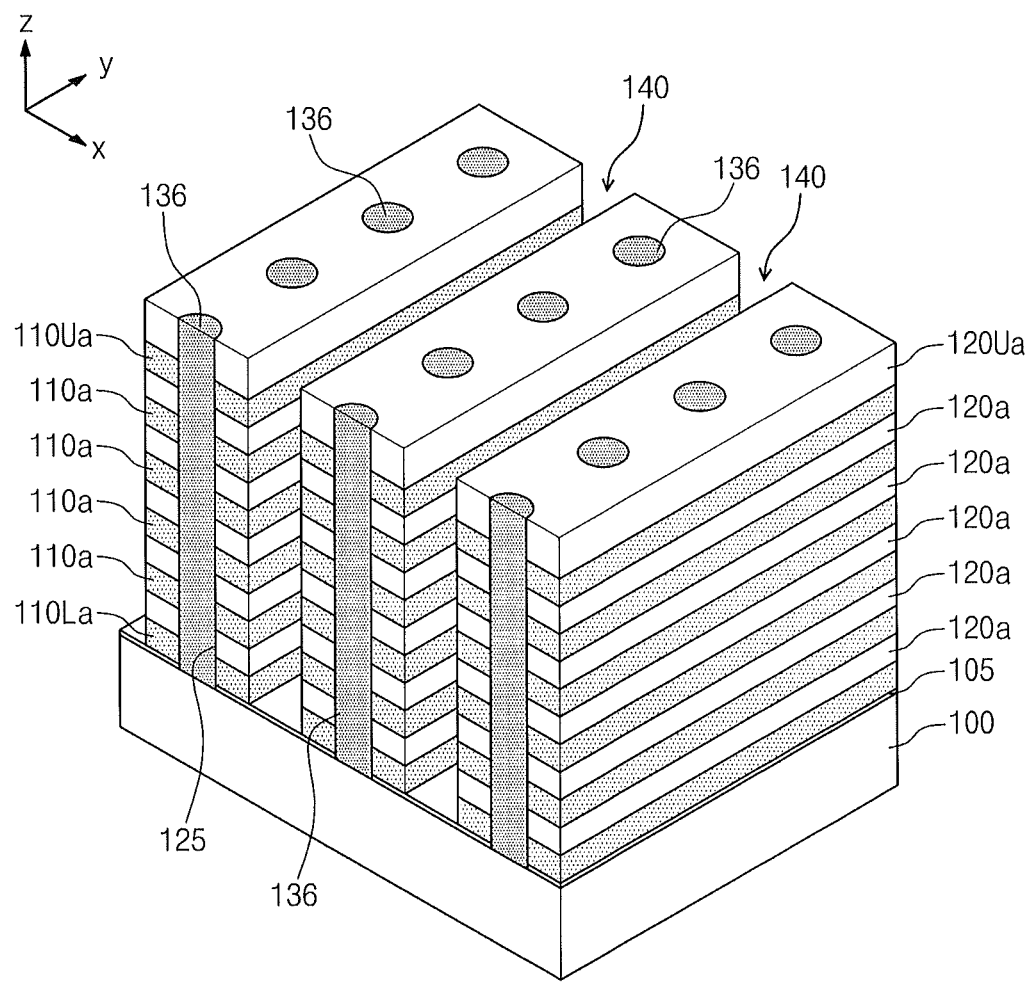

Referring to FIG. 1F, the insulating layers 120U and 120 and the sacrificial layers 110U, 110, and 110L may be successively patterned to form trenches 140. The trenches 140 may define sacrificial patterns 110La, 110a, and 110Ua and insulating patterns 120a and 120Ua, which may be alternatingly and repeatedly stacked. Formation of the trenches 140 may be performed by an anisotropic etching process. The trenches 140 may extend parallel to one another in the second direction (i.e., y-axis direction). By doing so, the sacrificial patterns 110La, 110a, and 110Ua and the insulating patterns 120a and 120Ua may have line shapes which extend parallel to one another in the second direction (i.e., y-axis direction).

The semiconductor pillars 136 arranged in the first direction (i.e., x-axis direction) may form a row, and the semiconductor pillars 136 arranged in the second direction (i.e., y-axis direction) may form a column. A plurality of rows and a plurality of columns may be arranged on the substrate 100. Each of the trenches 140 may be between a pair of columns of the semiconductor pillars 136. The plurality of semiconductor pillars 136 included in a single column may penetrate a single stack structure that includes the sacrificial patterns 110La, 110a, and 110Ua and the insulating patterns 120a and 120Ua, which may be alternatingly and repeatedly stacked.

The sacrificial patterns 110La, 110a and 110Ua and the insulating patterns 120a and 120Ua may define a sidewall of the trench 140. The buffer dielectric layer 105 may define a bottom of the trench 140. In further embodiments, if the buffer dielectric layer 105 is etched during the forming of the trenches 140, the substrate 100 may define the bottom of the trench 140.

Figure 1G:
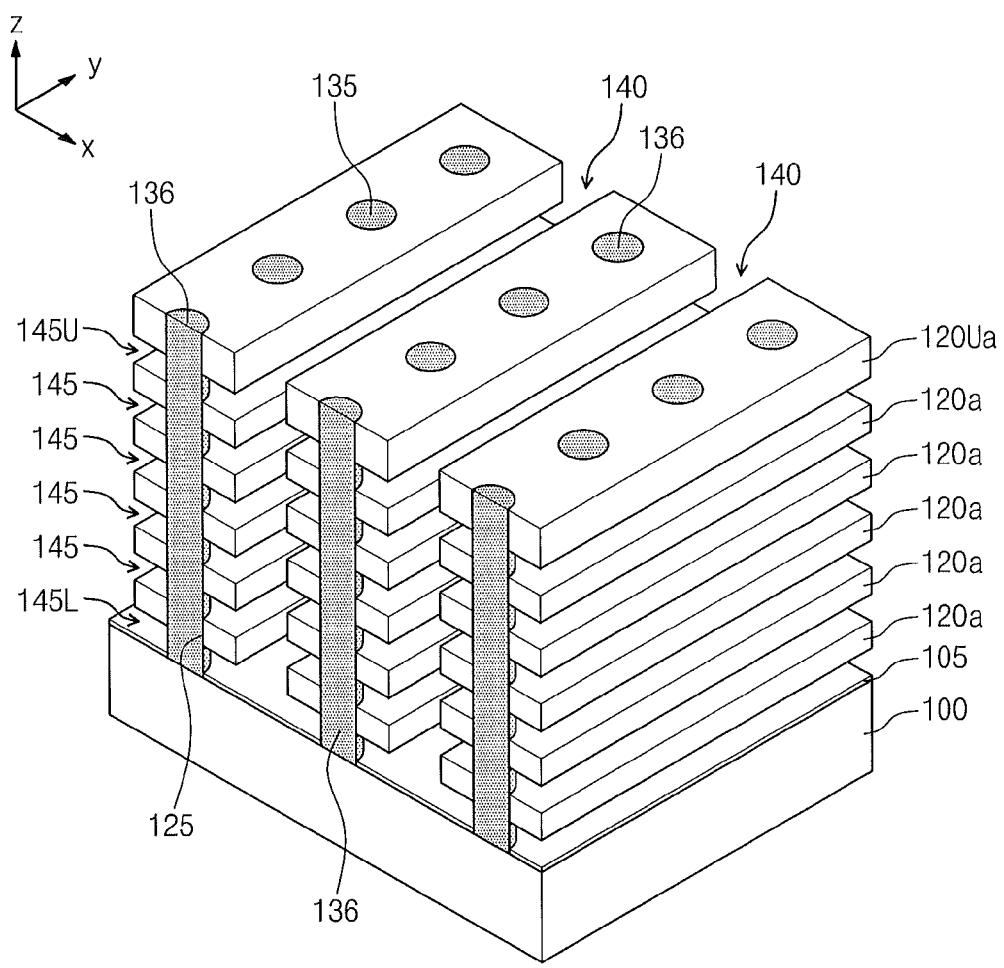

Referring to FIG. 1G, a selective etching process may be performed to remove the sacrificial patterns 110La, 110a, and 110Ua to form recess regions 145L, 145, and 145U. The selective etching process may be an isotropic etching process.

The selective etching process may be performed by a wet etching and/or an isotropic dry etching. The etch rate of the sacrificial patterns 110La, 110a, and 110Ua by the selective etching process may be greater than the etch rates of the insulating patterns 120a and 120Ua, the buffer dielectric layer 105, and the semiconductor pillar 136. Accordingly, after performing the selective etching process, the insulating patterns 120a and 120Ua, the buffer dielectric layer 105, and the semiconductor pillar 136 may remain.

The recess regions 145L, 145, and 145U may define a sidewall of the semiconductor pillar 136 that previously contacted the sacrificial patterns 110La, 110a and 110Ua. The lowermost recess region 145L may be formed by removing the lowermost sacrificial pattern 110La. The uppermost recess region 145U may be formed by removing the uppermost sacrificial pattern 110Ua. The recess regions 145 between the lowermost recess region 145L and the uppermost recess region 145U may be formed by removing the sacrificial patterns 110a between the lowermost sacrificial pattern 110La and the uppermost sacrificial pattern 110Ua. A bottom surface of the lowermost recess region 145L may be defined by the buffer dielectric layer 105. In embodiments omitting the buffer dielectric layer 105, the bottom surface of the lowermost recess region 145L may be defined by the substrate 100.

Figure 1H:
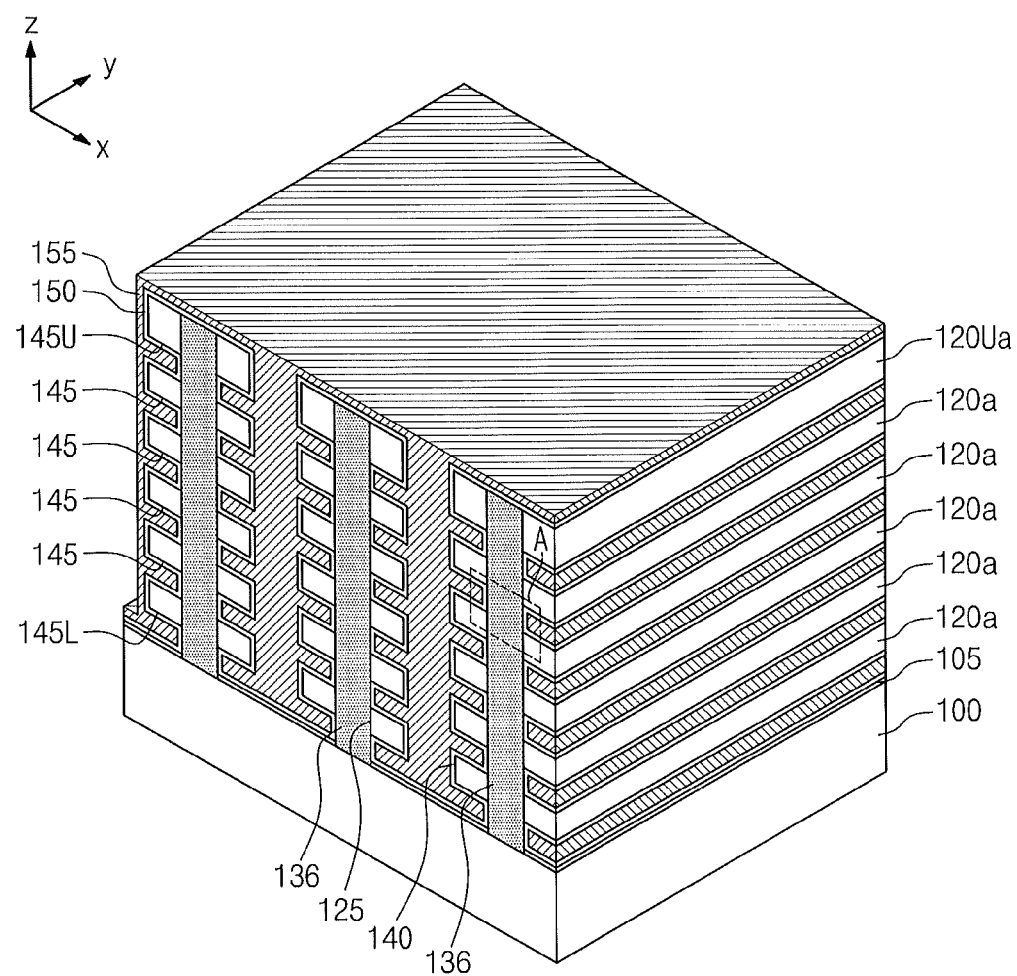

Referring to FIG. 1H, after forming the recess regions 145L, 145, and 145U, an information storage layer 150 may be formed on the substrate 100. The information storage layer 150 may be formed by using a deposition technique (e.g., chemical vapor deposition (CVD) or atomic layer deposition (ALD)) that can provide excellent step coverage. By doing so, the information storage layer 150 may be conformally formed. The information storage layer 150 may be formed at a substantially uniform thickness along inner surfaces of the recess regions 145L, 145, and 145U. The information storage layer 150 may partially fill the recess regions 145L, 145, and 145U.

Figure 2:
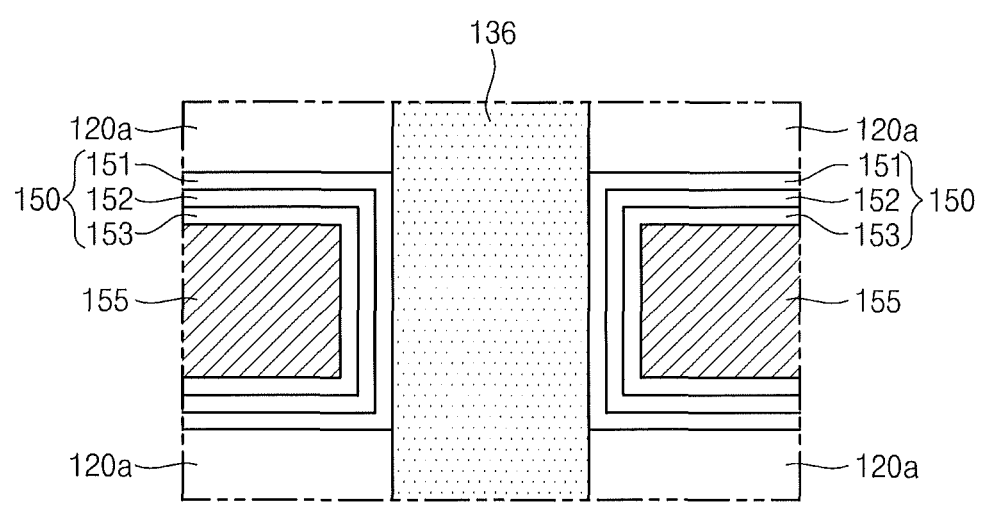
FIG. 2 is a detailed view of portion A of FIG. 1H for illustrating a method for fabricating an information storage layer included in a semiconductor device according to some embodiments.

A method of forming the information storage layer 150 will now be described. FIG. 2 is a detailed view of portion A of FIG. 1H for illustrating a method for fabricating the information storage layer 150 in a semiconductor device according to some embodiments.

Referring to FIG. 2, forming the information storage layer 150 may include sequentially forming a tunnel dielectric layer 151, a charge storage layer 152, and a blocking layer 153.

The tunnel dielectric layer 151 may be formed so as to cover the sidewall of the semiconductor pillar 136. The tunnel dielectric layer 151 may have a single layer structure or a multilayer structure. For example, the tunnel dielectric layer 151 may include at least one of a silicon oxynitride layer, a silicon nitride layer, a silicon oxide layer, and a metal oxide layer.

The charge storage layer 152 may be spaced apart from the semiconductor pillar 136 by the tunnel dielectric layer 151. The charge storage layer 152 may include charge trap sites, which can store charges. For example, the charge storage layer 152 may include at least one of a silicon nitride layer, a metal nitride layer, a metal oxynitride layer, a metal silicon oxide layer, a metal silicon oxynitride layer, and nanodots.

The blocking layer 153 may cover the charge storage layer 152. The blocking layer 153 may include at least one of a silicon oxide layer, a silicon nitride layer, a silicon oxynitride layer, and a high-k dielectric layer. The high-k dielectric layer may include at least one of a metal oxide layer, a metal nitride layer, and a metal oxynitride layer. The high-k dielectric layer may include hafnium (Hf), zirconium (Zr), aluminum (Al), tantalum (Ta), lanthanum (La), cerium (Ce), praseodymium (Pr), or the like. A dielectric constant of the blocking layer 153 may be higher than that of the tunnel dielectric layer 151.

Again referring to FIG. 1H, after forming the information storage layer 150, a gate conductive layer 155 may be formed on the substrate 100. The gate conductive layer 155 may fill the recess regions 145L, 145, and 145U. The gate conductive layer 155 may fill the trench 140 partially or completely. The gate conductive layer 155 may be electrically separated from the semiconductor pillar 136 and the substrate 100 by the information storage layer 150. The gate conductive layer 155 may be formed by using CVD, physical vapor deposition (PVD), or ALD. The gate conductive layer 155 may include at least one of a metal, a metal silicide, a conductive metal nitride, and a doped semiconductor material.

Figure 1I:
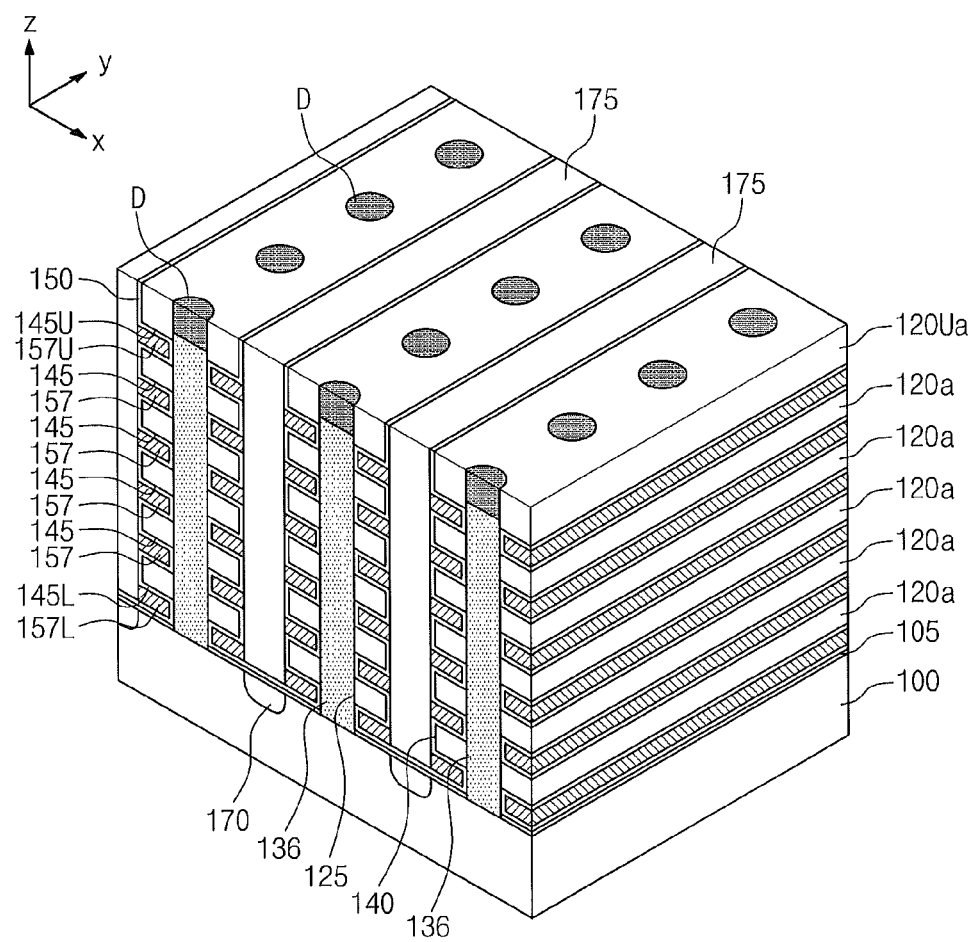

Referring to FIG. 1I, after the gate conductive layer 155 is formed, portions of the gate conductive layer 155 that are outside the recess regions 145L, 145, and 145U may be removed to form gate electrodes 157L, 157, and 157U in the recess regions 145L, 145, and 145U. The portions of the gate conductive layer 155 that are outside the recess regions 145L, 145, and 145U may be removed by using a wet etching and/or a dry etching. The gate electrodes 157L, 157, and 157U may be positioned at different layers along a third direction (i.e., z-axis direction) from the top surface of the substrate 100, and may be separated from one another.

The gate electrodes 157L, 157, and 157U and the insulating patterns 120a and 120Ua, which may be alternatingly stacked, may be defined as a single stack structure. The plurality of stack structures extending in the second direction (i.e., y-axis direction) may be spaced apart from one another on the substrate 100.

The gate electrodes 157L, 157, and 157U may correspond to some portions of the gate conductive layers 155 in the recess regions 145L, 145, and 145U, respectively. The lowermost gate electrode 157L may correspond to a gate of a lower select transistor, and the uppermost gate electrode 157U may correspond to a gate of an upper select transistor. The gate electrodes 157 between the lowermost gate electrode 157L and the uppermost gate electrode 157U may correspond to control gates of memory cells.

A common source region 170 may be formed in/on the substrate 100 below the bottom surface of the trench 140. The common source region 170 may have a line shape extending in the second direction (i.e., y-axis direction). The common source region 170 may be a region doped with a second type of dopants, such as n-type or p-type dopants. The second type of dopants may be different from the first type of dopants. The common source region 170 may be formed by implanting second type dopant ions into the substrate 100. The uppermost insulating pattern 120Ua may be used as an ion implantation mask. Portions of the information storage layer 150 that are on the bottom surface of the trench 140, and/or portions of the buffer dielectric layer 105 that are on the bottom surface of the trench 140, may be used as an ion implantation buffer layer.

A drain region D may be formed in an upper portion of the semiconductor pillar 136. The drain region D may be doped with the second type of dopants. The drain region D may be formed by providing the second type of dopants to the upper portion of the semiconductor pillar 136. A bottom surface of the drain region D may be at a higher level than the top surface of the uppermost gate electrode 157U. In other words, the bottom surface of the drain region D may be more distant from the substrate 100 than the top surface of the uppermost gate electrode 157U is distant from the substrate 100. Alternatively, the bottom surface of the drain region D may be at a substantially similar level as the top surface of the uppermost gate electrode 157U. The drain region D may be formed simultaneously with the common source region 170. Alternatively, the drain region D may be formed prior to forming the common source region 170. As such, the drain region D may be formed before forming the trench 140 and after forming the semiconductor pillar 136. Alternatively, the drain region D may be formed after forming the common source region 170.

A device isolation pattern 175 may be formed to fill the trench 140. Forming the device isolation pattern 175 may include forming a device isolation layer on the substrate 100, and performing a planarization by using the top surface of the information storage layer 150 on the uppermost insulating pattern 120Ua as an etch stop layer. The device isolation pattern 175 may include an insulating material. For example, the device isolation pattern 175 may include a high density plasma oxide layer, a spin on glass (SOG) layer, and/or a CVD oxide layer.

After forming the device isolation pattern 175, the uppermost insulating pattern 120Ua may be exposed by etching the exposed information storage layer 150 on the uppermost insulating pattern 120Ua. As such, portions of the drain region D, including a top surface and/or sidewalls of the drain region D, may be exposed.

A bit line (such as the bit line BL of FIG. 5) electrically connected to the drain region D may be formed. The bit line (such as the bit line BL of FIG. 5) may extend in the first direction (i.e., x-axis direction). The bit line (such as the bit line BL of FIG. 5) may be formed directly on the uppermost insulating pattern 120Ua and the device isolation pattern 175. Alternatively, after forming an interlayer dielectric layer covering the uppermost insulating pattern 120Ua and the device isolation pattern 175, the bit line (such as the bit line BL of FIG. 5) may be formed on the interlayer dielectric layer. As such, the bit line (such as the bit line BL of FIG. 5) may electrically contact the drain region D via a contact plug penetrating the interlayer dielectric layer.

According to some embodiments, because the semiconductor solution 132 may fill the channel openings 125 without any void or seam, the semiconductor pillar 136 may stably fill the channel openings 125 without any void or seam.

According to some embodiments, the semiconductor solution 132 may completely fill the channel openings 125. Alternatively, the semiconductor solution 132 may fill only a part of the channel openings 125.

Figure 3A:
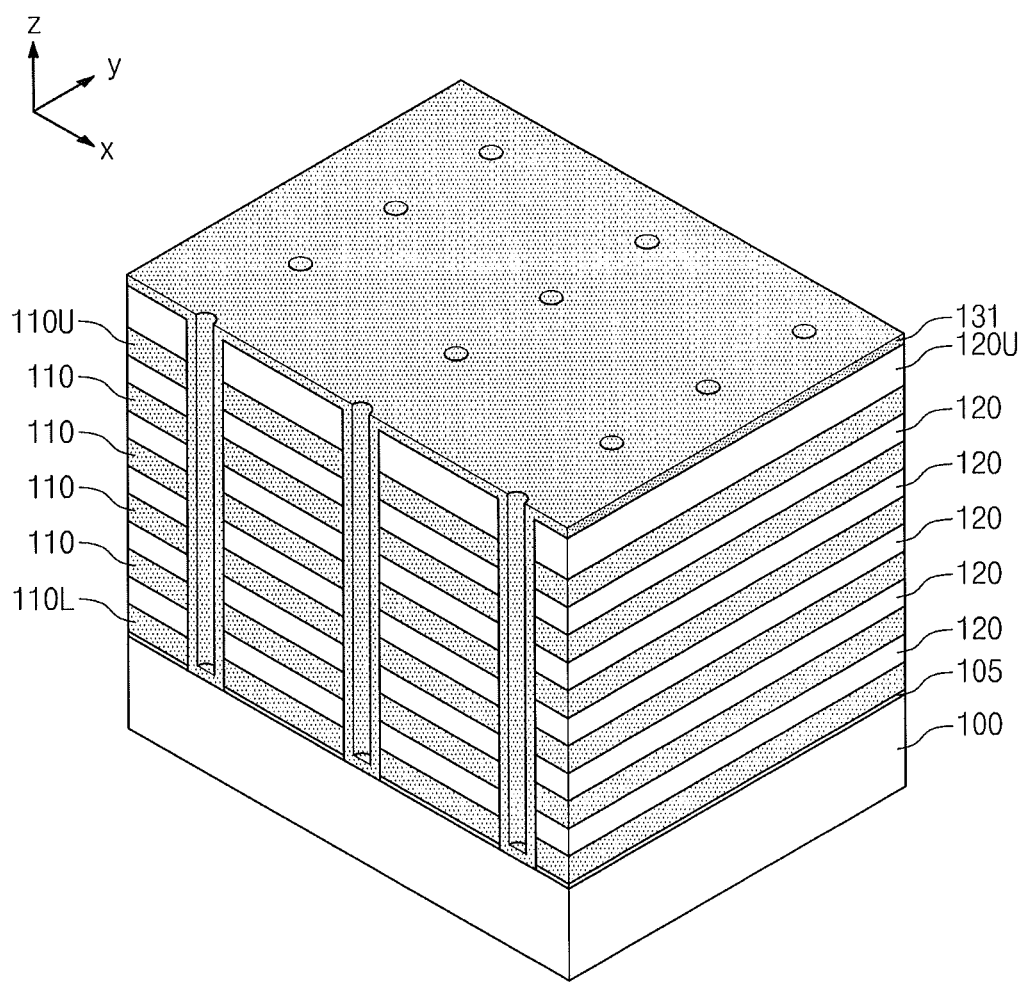
FIGS. 3A through 3C are perspective views for illustrating a method for fabricating a semiconductor device according to a some embodiments.
Figure 3B:
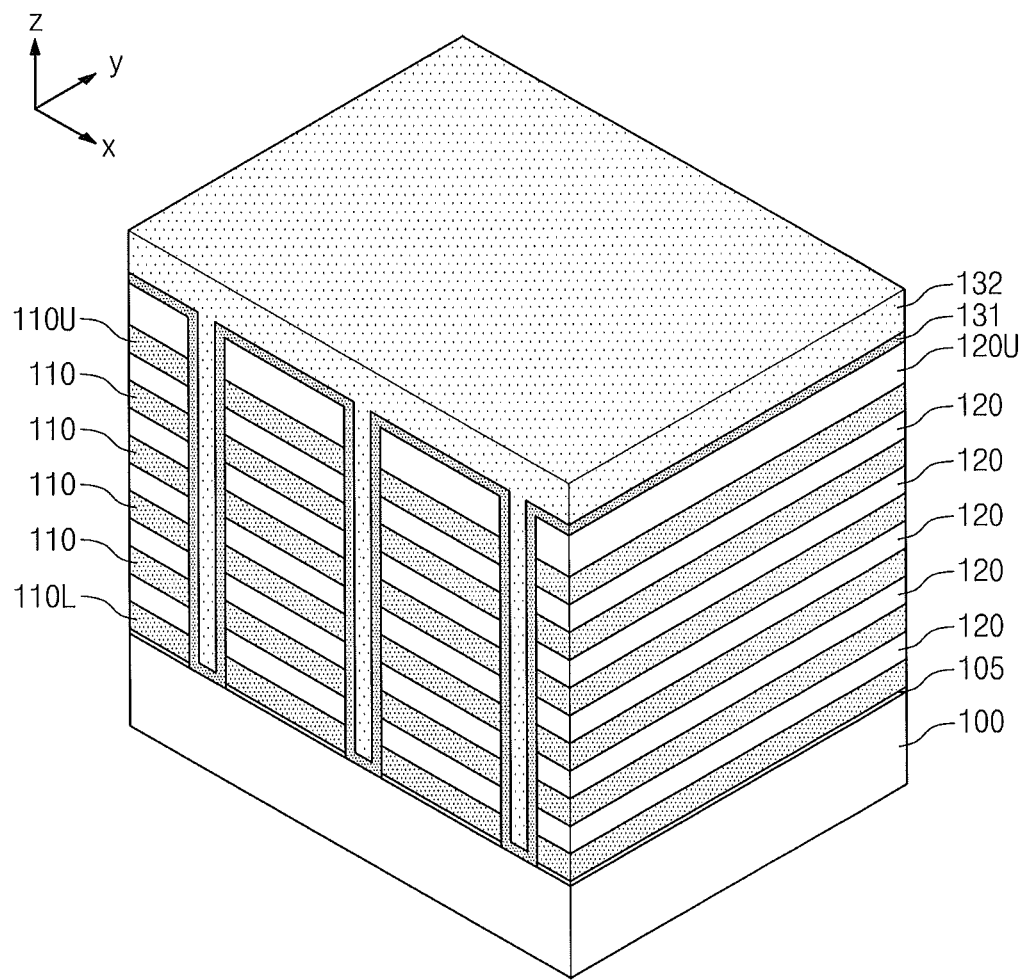
Figure 3C:
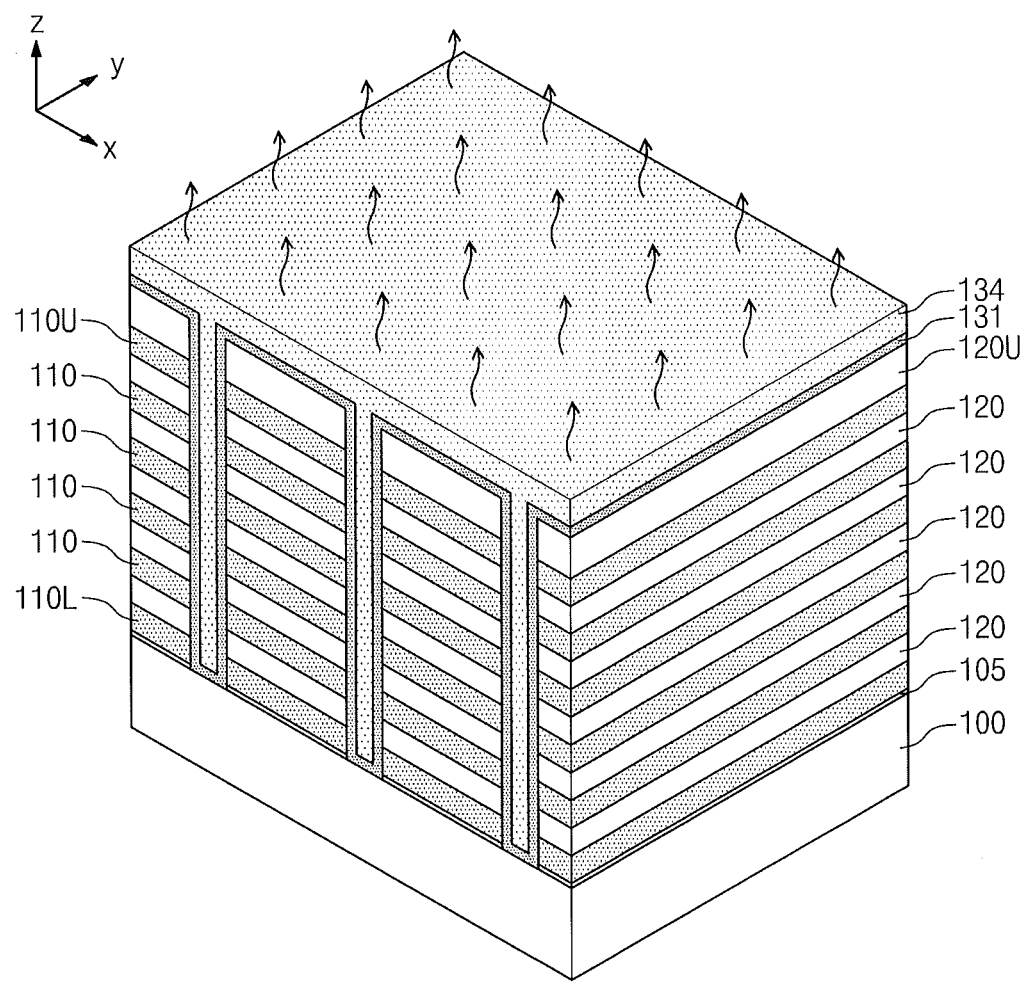

FIGS. 3A through 3C are perspective views for illustrating a modified example of the method for fabricating a semiconductor device according to some embodiments.

Referring to FIG. 3A, as in the method described with reference to FIGS. 1A and 1B, channel openings 125 penetrating sacrificial layers 110L, 110, and 110U and insulating layers 120L, 120, and 120U, which may be alternatingly and repeatedly stacked on the substrate 100, may be provided. An auxiliary semiconductor layer 131 may partially fill the channel openings 125. The auxiliary semiconductor layer 131 may conformally cover bottom surfaces and sidewalls of the channel openings 125. The auxiliary semiconductor layer 131 may conformally cover a top surface of the uppermost insulating layer 120U. The auxiliary semiconductor layer 131 may have a substantially constant thickness. The thickness of the auxiliary semiconductor layer 131 may be smaller than half of a width of one of the channel openings 125. The auxiliary semiconductor layer 131 may include a semiconductor material deposited by using any one of a CVD process and an ALD process. The auxiliary semiconductor layer 131 may be an amorphous semiconductor layer.

Referring to FIG. 3B, a semiconductor solution 132 may be formed on the auxiliary semiconductor layer 131 in the channel openings 125. The semiconductor solution 132 may be formed by using a spin-on process. The semiconductor solution 132 may completely fill the channel openings 125. A volume occupied by the semiconductor solution 132 in the channel opening 125 may be greater than a volume occupied by the auxiliary semiconductor layer 131 in the channel opening 125. The semiconductor solution 132 may be formed so as to fully cover a top surface of the auxiliary semiconductor layer 131 on the uppermost insulating layer 120U. The channel openings 125 may be filled with the semiconductor solution 132 without any void or defect by using a spin-on process. The semiconductor solution 132 may be the semiconductor solution 132 described with reference to FIG. 1C.

Referring to FIG. 3C, the semiconductor solution 132 may be thermally treated. By the thermal treatment, the semiconductor solution 132 may be changed to a solid semiconductor layer 134. By the thermal treatment, the dispersion media in the semiconductor solution 132 may be vaporized. Additionally, by the thermal treatment, the additional element and the semiconductor material in the dispersoid may be separated from each other. The separated additional element may be vaporized. Resultantly, the semiconductor solution 132 may be changed to the solid semiconductor layer 134.

The semiconductor layer 134 may be in an amorphous state. The thermal treatment may include irradiating ultraviolet rays onto the semiconductor solution 132. As the dispersion media are vaporized, a distance from the top surface of the uppermost insulating layer 120U to a top surface of the semiconductor layer 134 may be less than a distance from the top surface of the uppermost insulating layer 120U to the top surface of the semiconductor solution 132. In other words, the thickness of the semiconductor layer 134 on the uppermost insulating layer 120U may be less than the thickness of the semiconductor solution 132 on the uppermost insulating layer 120U.

Again referring to FIG. 1E, after the thermal/heat treatment, a planarizing process may be performed by using the uppermost insulating layer 120U as an etch stop layer. By the planarizing process, a portion of the semiconductor layer 134 on the uppermost insulating layer 120U and the auxiliary semiconductor layer 131 on the uppermost insulating layer 120U may be removed. As such, the semiconductor layer 134 may be confined in the channel openings 125.

After the planarizing process, a process for crystallizing the semiconductor layer 134 and the auxiliary semiconductor layer 131 may be performed. By the crystallizing process, the amorphous semiconductor layer 134 and the amorphous auxiliary semiconductor layer 131 may be changed to a crystalline semiconductor pillar 136. The semiconductor pillar 136 may be in a single crystalline state or polycrystalline state. The semiconductor pillar 136 may contact the top surface of the substrate 100. In some embodiments, the semiconductor pillar 136 may directly contact the top surface of the substrate. The crystallizing of the semiconductor layer 134 and the auxiliary semiconductor layer 131 may include at least one of irradiating a laser beam to the semiconductor layer 134 and the auxiliary semiconductor layer 131, or supplying heat to the semiconductor layer 134 and the auxiliary semiconductor layer 131.

Thereafter, the method for fabricating a semiconductor device described with reference to FIGS. 1F through 1I may be provided.

Figure 4A:
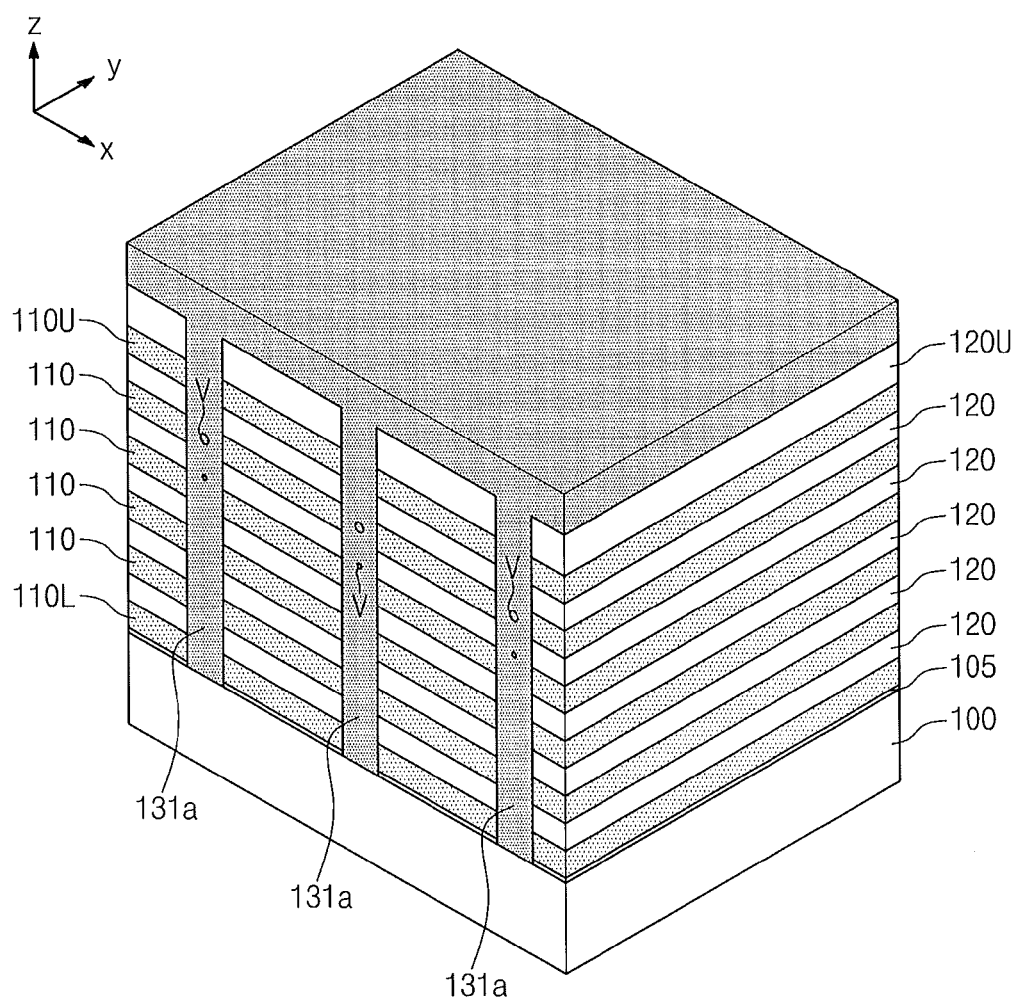
FIGS. 4A through 4C are perspective views for illustrating a method for fabricating a semiconductor device according to some embodiments.
Figure 4B:
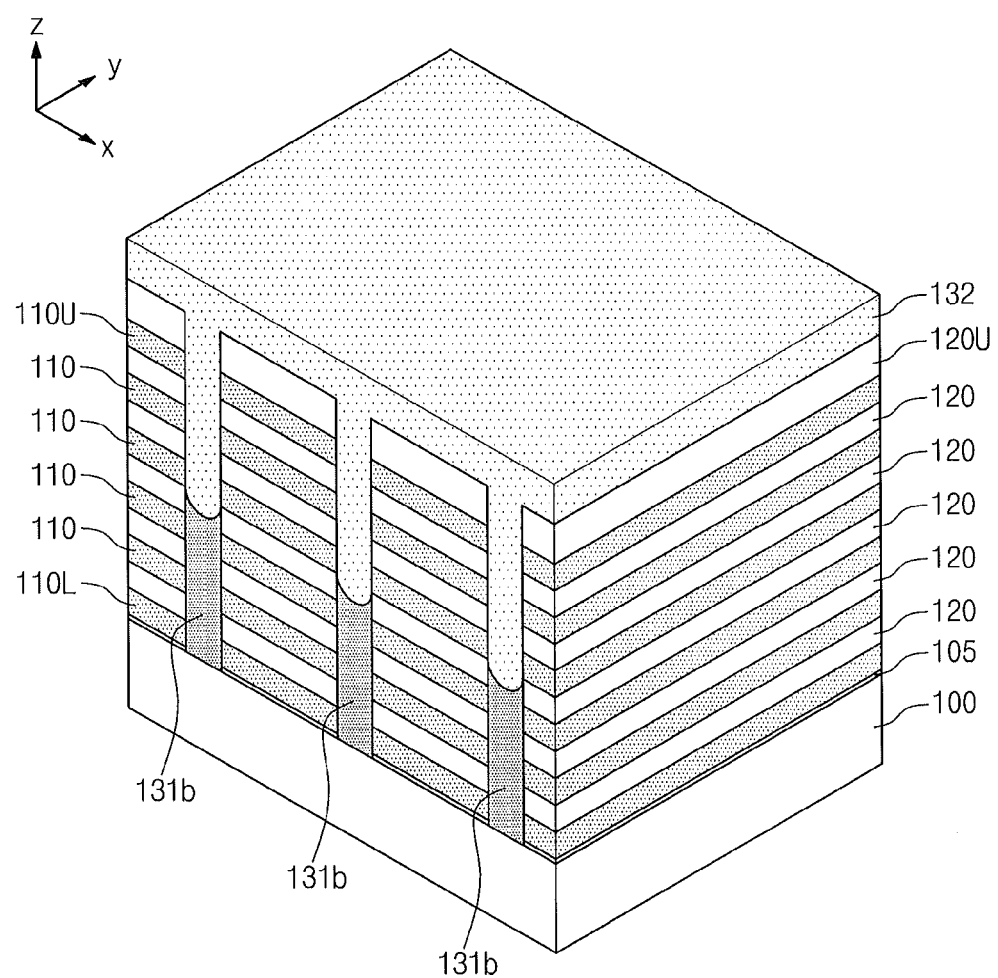
Figure 4C:
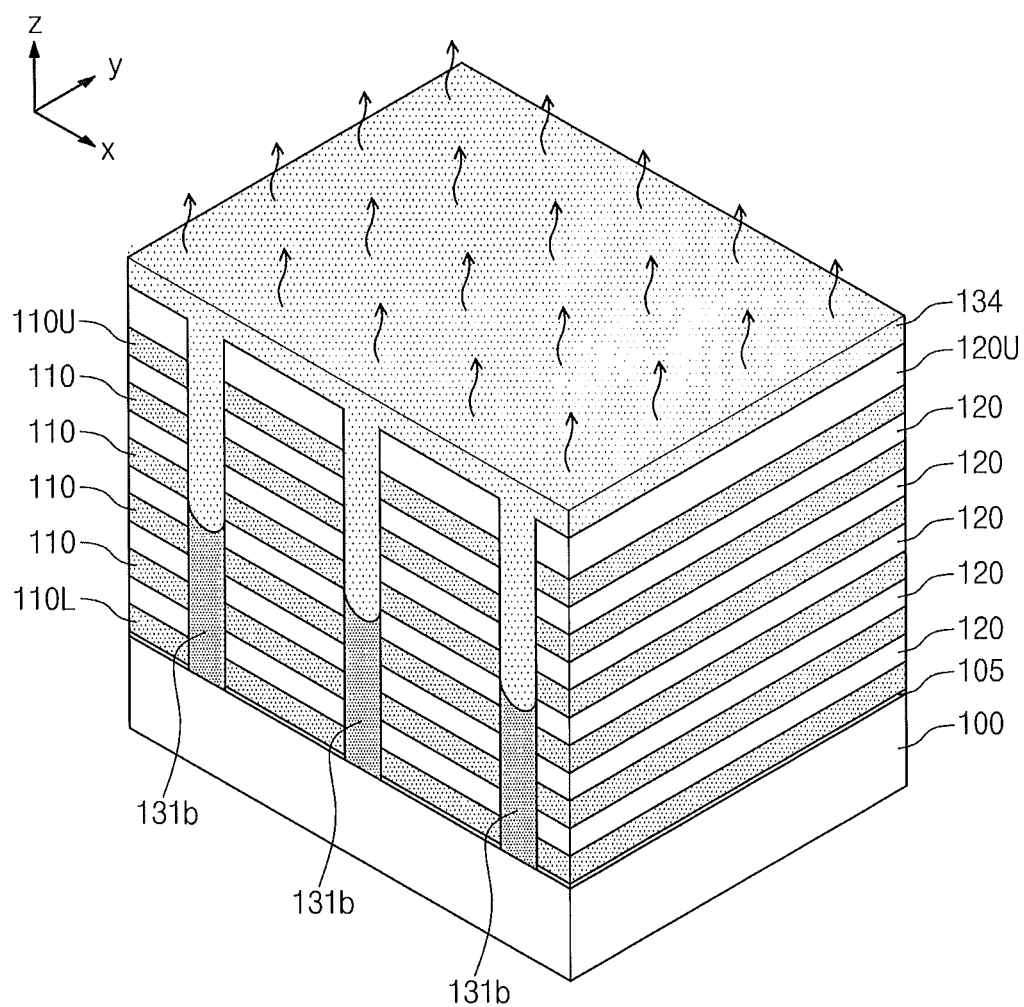

FIGS. 4A through 4C are perspective views for illustrating a method for fabricating a semiconductor device according to some embodiments.

Referring to FIG. 4A, as in the method described with reference to FIGS. 1A and 1B, channel openings 125 penetrating sacrificial layers 110L, 110, and 110U and insulating layers 120L, 120, and 120U, which may be alternatingly and repeatedly stacked on the substrate 100, may be provided. A preliminary auxiliary semiconductor layer 131a may be formed on the substrate 100 having the channel openings 125. The preliminary auxiliary semiconductor layer 131a may completely fill the channel openings 125 and may cover a top surface of the uppermost insulating layer 120U. The preliminary auxiliary semiconductor layer 131a may have a thickness equal to or greater than half of a width of the channel opening 125. The preliminary auxiliary semiconductor layer 131a may include a semiconductor material deposited by using any one of a CVD process and an ALD process. The preliminary auxiliary semiconductor layer 131a may be an amorphous semiconductor layer.

In embodiments where the preliminary auxiliary semiconductor layer 131a is formed in the channel opening 125 by using a deposition process, a high aspect ratio of the channel opening 125 may cause voids V to be formed in the preliminary auxiliary semiconductor layer 131a in the channel opening 125. The number of voids V may increase toward the bottom surface of the channel opening 125, and may be greater in a center of the bottom surface than in an edge of the bottom surface.

Referring to FIG. 4B, the preliminary auxiliary semiconductor layer 131a may be recessed. For example, the preliminary auxiliary semiconductor layer 131a may be recessed by using anisotropic etching or isotropic etching. Portions of the preliminary auxiliary semiconductor layer 131a on the uppermost insulating layer 120U may be removed to expose the top surface of the uppermost insulating layer 120U. By removing an upper portion of the preliminary auxiliary semiconductor layer 131a in the channel opening 125, an auxiliary semiconductor layer 131b may be defined. The upper portion of the preliminary auxiliary semiconductor layer 131a may be removed until a void V in the preliminary auxiliary semiconductor layer 131a is removed. An entire top surface of the auxiliary semiconductor layer 131b may be at a lower level than a top end of the channel opening 125. The auxiliary semiconductor layer 131b may cover the bottom surface of the channel opening 125 and may partially cover the sidewall of the channel opening 125. An upper portion of the sidewall of the channel opening 125 may be exposed.

A central portion of the top surface of the auxiliary semiconductor layer 131b may be at a lower level than an edge of the top surface of the auxiliary semiconductor layer 131b. In other words, the top surface of the auxiliary semiconductor layer 131b may be concavely curved. For example, the top surface of the auxiliary semiconductor layer 131b may have a U-shaped section. This may be due to a larger number of voids and other defects in a center of the bottom surface of the preliminary auxiliary semiconductor layer 131a in the channel opening 125 than in an edge of the bottom surface of the preliminary auxiliary semiconductor layer 131a in the channel opening 125.

A semiconductor solution 132 may be formed on the auxiliary semiconductor layer 131b in the channel openings 125. The semiconductor solution 132 may be formed by using a spin-on process. The semiconductor solution 132 may completely fill the channel openings 125. In such embodiments, a volume occupied by the semiconductor solution 132 in the channel opening 125 may be greater than a volume occupied by the auxiliary semiconductor layer 131b in the channel opening 125. The semiconductor solution 132 may be formed so as to fully cover the top surface of the uppermost insulating layer 120U.

The semiconductor solution 132 may be the semiconductor solution 132 described with reference to FIG. 1C. By forming the semiconductor solution 132 having the viscosity using the spin-on process, the channel openings 125 may be filled by the semiconductor solution 132 without any void or seam.

Referring to FIG. 4C, the semiconductor solution 132 may be thermally treated. By the thermal treatment, the semiconductor solution 132 may be changed to a solid semiconductor layer 134. By the thermal treatment, the dispersion media in the semiconductor solution 132 may be vaporized. Additionally, by the thermal treatment, the additional element and the semiconductor material in the dispersoid may be separated from each other. The separated additional element may be vaporized. Resultantly, the semiconductor solution 132 may be changed to the solid semiconductor layer 134.

The semiconductor layer 134 may be in an amorphous state. The thermal treatment may be the same as that described with reference to FIG. 3C. As the dispersion media are vaporized, a distance from the top surface of the uppermost insulating layer 120U to a top surface of the semiconductor layer 134 may be less than a distance from the top surface of the uppermost insulating layer 120U to the top surface of the semiconductor solution 132. In other words, the thickness of the semiconductor layer 134 on the uppermost insulating layer 120U may be less than the thickness of the semiconductor solution 132 on the uppermost insulating layer 120U.

Again referring to FIG. 1E, after the thermal/heat treatment, a planarizing process may be performed by using the uppermost insulating layer 120U as an etch stop layer. By the planarizing process, a portion of the semiconductor layer 134 on the uppermost insulating layer 120U may be removed. By doing so, the semiconductor layer 134 may be confined in the channel openings 125.

After the planarizing process, a process for crystallizing the semiconductor layer 134 and the auxiliary semiconductor layer 131b may be performed. By the crystallizing process, the amorphous semiconductor layer 134 and the amorphous auxiliary semiconductor layer 131b may be changed to a crystalline semiconductor pillar 136. The semiconductor pillar 136 may be in a single crystalline state or polycrystalline state. Crystallizing the semiconductor layer 134 and the auxiliary semiconductor layer 131b may include at least one of irradiating a laser beam to the semiconductor layer 134 and the auxiliary semiconductor layer 131b or supplying heat to the semiconductor layer 134 and the auxiliary semiconductor layer 131b.

Thereafter, the method for fabricating a semiconductor device described with reference to FIGS. 1F through 1I may be provided.

Figure 5:
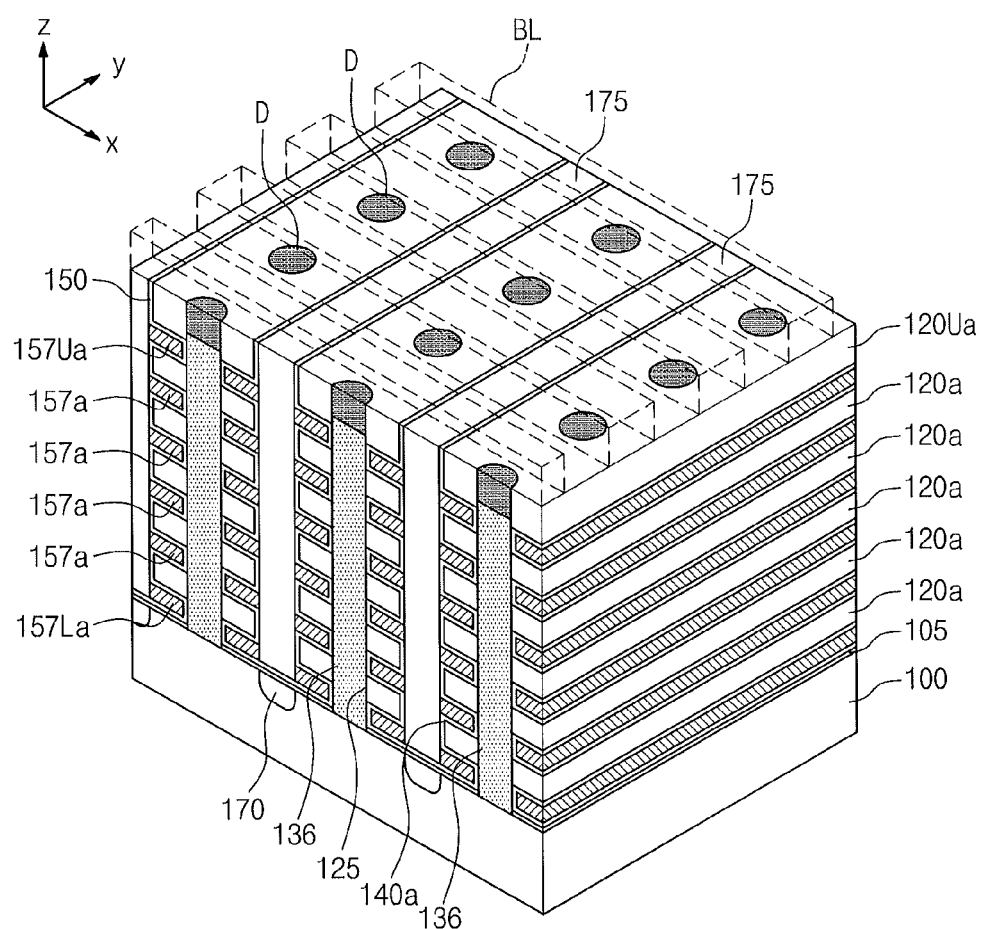
FIG. 5 is a perspective view for illustrating a semiconductor device according to some embodiments.

FIG. 5 is a perspective view for illustrating a semiconductor device according to some embodiments.

Referring to FIG. 5, a substrate 100 may be prepared. The substrate 100 may be a semiconductor substrate. For example, the substrate 100 may be a silicon substrate, a germanium substrate, a silicon-germanium substrate, a compound semiconductor substrate, or the like. The substrate 100 may be doped with the first type of dopants.

Gate electrodes 157L, 157, and 157U and insulating patterns 120a and 120Ua may be alternatingly stacked on the substrate 100. The gate electrodes 157L, 157, and 157U and the insulating patterns 120a and 120Ua, which may be alternatingly stacked, may constitute a single stack structure. A plurality of the stack structures may be disposed on the substrate 100. The plurality of stack structures may be spaced apart from one another in a first direction parallel to a top surface of the substrate 100. The gate electrodes 157L, 157, and 157U and the insulating patterns 120a and 120Ua may extend in parallel in a second direction, which is parallel to the top surface of the substrate 100 and perpendicular to the first direction. That is, the plurality of stack structures may extend in parallel in the second direction. The first direction may correspond to an x-axis direction on the drawing, and the second direction may correspond to a y-axis direction.

The insulating patterns 120a and 120Ua may include an oxide. For example, the insulating patterns 120a and 120Ua may include a silicon oxide. The gate electrodes 157L, 157, and 157U may include a conductive material. For example, the gate electrodes 157L, 157, and 157U may include at least one of metals (e.g., tungsten (W), aluminum (Al), titanium (Ti), tantalum (Ta), etc.), conductive metal nitrides (e.g., titanium nitride, tantalum nitride, etc.), and doped semiconductor materials (e.g., doped silicon, doped germanium, doped silicon germanium, etc.).

A device isolation pattern 175 may be disposed between adjacent ones of the stack structures. In other words, the device isolation pattern 175 may be disposed on the substrate 100 between adjacent stack structures of the gate electrodes 157L, 157, and 157U and the insulating patterns 120a and 120Ua. The device isolation pattern 175 may include a silicon oxide layer.

A semiconductor pillar 136 may penetrate the gate electrodes 157L, 157, and 157U and the insulating patterns 120a and 120Ua, which may be alternatingly and repeatedly stacked. The semiconductor pillar 136 may extend in a third direction that is vertical/perpendicular to the first direction and the second direction. The third direction is a direction vertical/perpendicular to the top surface of the substrate 100. The third direction may correspond to a z-axis direction on the drawings. A plurality of the semiconductor pillars 136 may be provided on the semiconductor substrate 100. The plurality of semiconductor pillars 136 may be arranged two-dimensionally in the first direction and the second direction. The plurality of semiconductor pillars 136 may penetrate the respective stack structures. The plurality of semiconductor pillars 136 penetrating the respective stack structures may be spaced apart from one another in the second direction. A drain region D may be formed in an upper portion of the semiconductor pillar 136. The drain region D may be a region doped with the second type of dopants. The semiconductor pillar 136 may be a single crystalline semiconductor or polycrystalline semiconductor.

An information storage layer 150 may be disposed between the sidewalls of the semiconductor pillars 136 and the gate electrodes 157L, 157, and 157U. The information storage layer 150 may include a tunnel dielectric layer 151, a charge storage layer 152, and a blocking layer 153, which are described with reference to FIG. 2. Portions of the information storage layer 150 between the gate electrode 157 and the semiconductor pillar 136 may correspond to a data storage element of the memory cell. Portions of the information storage layer 150 between the lowermost gate electrode 157L and the semiconductor pillar 136 may be included in a gate dielectric layer of the lower select transistor. Portions of the information storage layer 150 between the uppermost gate electrode 157U and the semiconductor pillar 136 may be included in a gate dielectric layer of an upper select transistor.

Each of the semiconductor pillars 136, the gate electrodes 157L, 157, and 157U surrounding each of the semiconductor pillars 136, and the information storage layer 150 between each of the semiconductor pillars 136 and the gate electrodes 157L, 157, and 157U may be included in a single vertical cell string. The vertical cell string may include a lower select transistor, a plurality of memory cells, and an upper select transistor, which may be connected in series to one another and may be stacked. The lowermost gate electrode 157L may correspond to a gate of the lower select transistor. The uppermost gate electrode 157U may correspond to a gate of the upper select transistor. The gate electrodes 157 between the lowermost gate electrode 157L and the uppermost gate electrode 157U may correspond to gates of the memory cells.

The uppermost gate electrodes 157U included in the respective stack structures may be electrically separated. The gate electrodes 157 positioned at the same distance in the third direction from the substrate 100 may be electrically connected to one another. The lowermost gate electrodes 157L may be electrically connected to one another.

A common source region 170 may be disposed in the substrate 100 below the device isolation pattern 175. For example, the common source region 170 may be between the device isolation pattern 175 and the substrate 100. The common source region 170 may have a line shape extending in the second direction (i.e., y-axis direction). The common source region 170 may be a region doped with the second type of dopants. The lowermost gate electrodes 157L may control an electrical connection to the common source region 170 and the semiconductor pillar 136.

A bit line BL may be electrically connected to the drain region D. The uppermost gate electrodes 157U may control an electrical connection between the bit line BL and the vertical cell string. The bit line BL may extend in the first direction (i.e., x-axis direction). That is, the bit line BL may cross the gate electrodes 157L, 157, and 157U. The bit line BL may cross a plurality of the stack structures. A plurality of the bit lines BL may be disposed on the substrate 100. The plurality of bit lines BL may be parallel to one another. One bit line BL may be electrically connected to the plurality of drain regions D, which may be respectively formed in the plurality of semiconductor pillars 136 constituting a single row arranged in the first direction. Alternatively, the bit line BL may be disposed on an interlayer dielectric layer disposed on the uppermost insulating pattern 120Ua and the device isolation pattern 175. In such embodiments, the bit line BL may be electrically connected to the drain region D via a contact plug penetrating the interlayer dielectric layer.

A method for fabricating a semiconductor device according to some embodiments will be described. FIGS. 6A through 6G are perspective views for illustrating a method for fabricating a semiconductor device according to some embodiments.

Figure 6A:
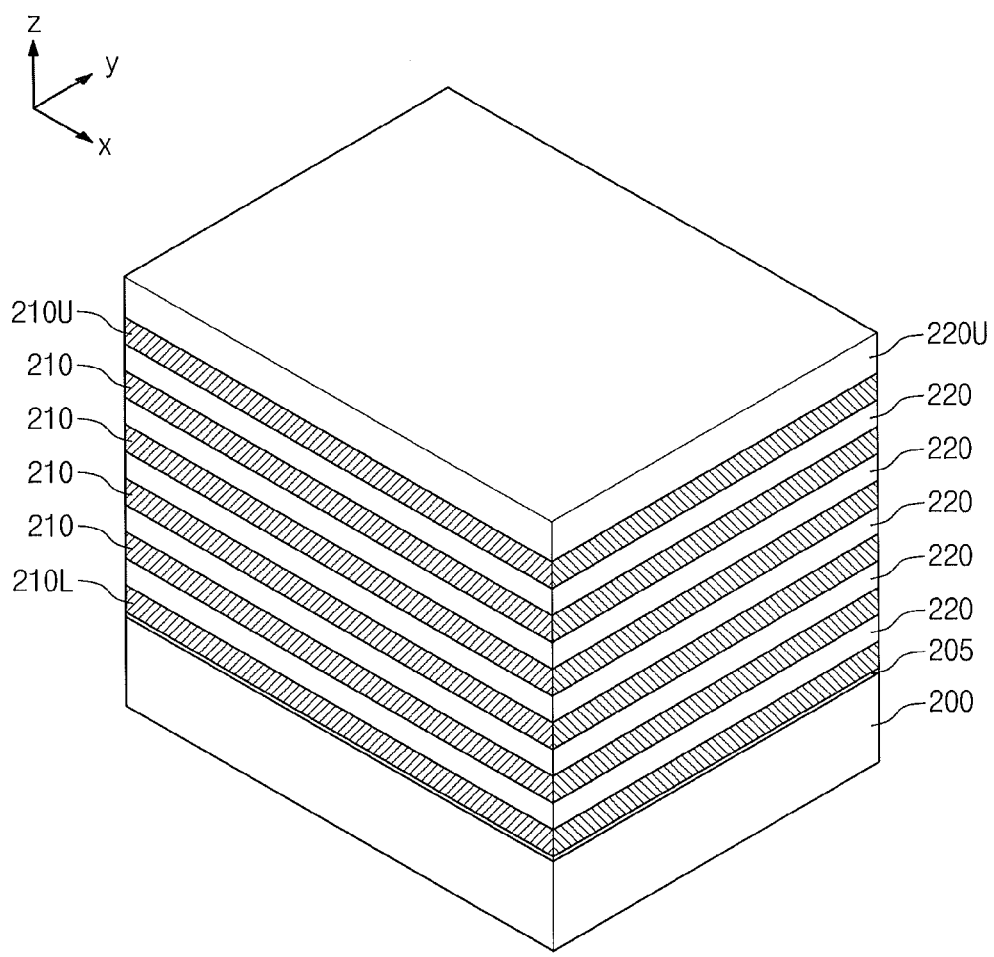
FIGS. 6A through 6G are perspective views for illustrating a method for fabricating a semiconductor device according to some embodiments.

Referring to FIG. 6A, a substrate 200 may be prepared. The substrate 200 may be a semiconductor substrate. For example, the substrate 200 may be a silicon substrate, a germanium substrate, a silicon-germanium substrate, a compound semiconductor substrate, or the like. The substrate 200 may be doped with the first type of dopants.

A buffer dielectric layer 205 may be formed on the substrate 200. The buffer dielectric layer 205 may be formed of an oxide layer, particularly, a thermal oxide layer. By using the buffer dielectric layer 205 as an ion implantation mask, a common source region may be formed in the substrate 200. The common source region may be a region doped with the second type of dopants.

First material layers, and second material layers including a different material from a material(s) constituting the first material layers, may be alternatingly and repeatedly stacked on the substrate 200. The first material layers may be gate electrodes 210L, 210, and 210U, and the second material layers may be insulating layers 220 and 220U. The gate electrodes 210L, 210, and 210U may be formed of the same material. The lowermost gate electrode 210L and the uppermost gate electrode 210U may be thicker than the gate electrodes 210 between the lowermost gate electrode 210L and the uppermost gate electrode 210U. The gate electrodes 210 between the lowermost gate electrode 210L and the uppermost gate electrode 210U may be formed at the same thickness. The insulating layers 220 and 220U may be formed of the same material. The uppermost insulating layer 220U may be formed thicker than the underlying insulating layers 220. The insulating layers 220 underlying the uppermost insulating layer 220U may be formed at the same thickness.

Figure 6B:
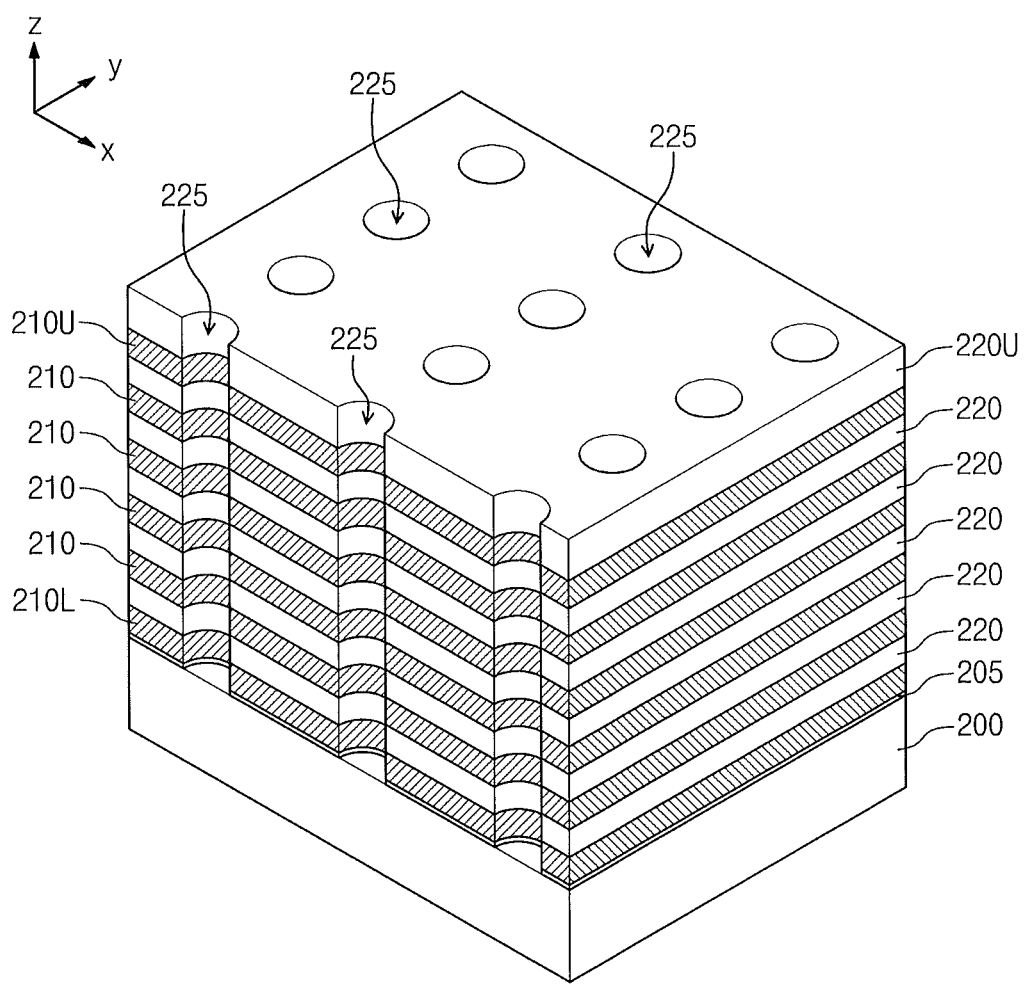

Referring to FIG. 6B, the buffer dielectric layer 205, the insulating layers 220U and 220, and the gate electrodes 210U, 210, and 210L may be successively patterned to form channel openings 225 exposing a top surface of the substrate 200. For example, the top surface of the substrate 200 may be directly adjacent the buffer dielectric layer 205, and patterning the buffer dielectric layer 205 to form the channel openings 225 may remove portions of the buffer dielectric layer 205 directly adjacent the substrate 200. The channel openings 225 may be formed by using an anisotropic etch process. The channel openings 225 may have a hole shape, and the hole shape may be substantially uniform through the buffer dielectric layer 205, the insulating layers 220U and 220, and the gate electrodes 210U, 210 and 210L. The channel openings 225 may be spaced apart from one another. The channel openings 225 may be arranged two-dimensionally along a first direction and a second direction perpendicular to the first direction. The first direction and the second direction may be parallel to the top surface of the substrate 200. In the figures, an x-axis direction may correspond to the first direction, and a y-axis direction may correspond to the second direction. The channel openings 225 may include various shapes in plan view, including circular, elliptical, or polygonal.

Figure 6C:
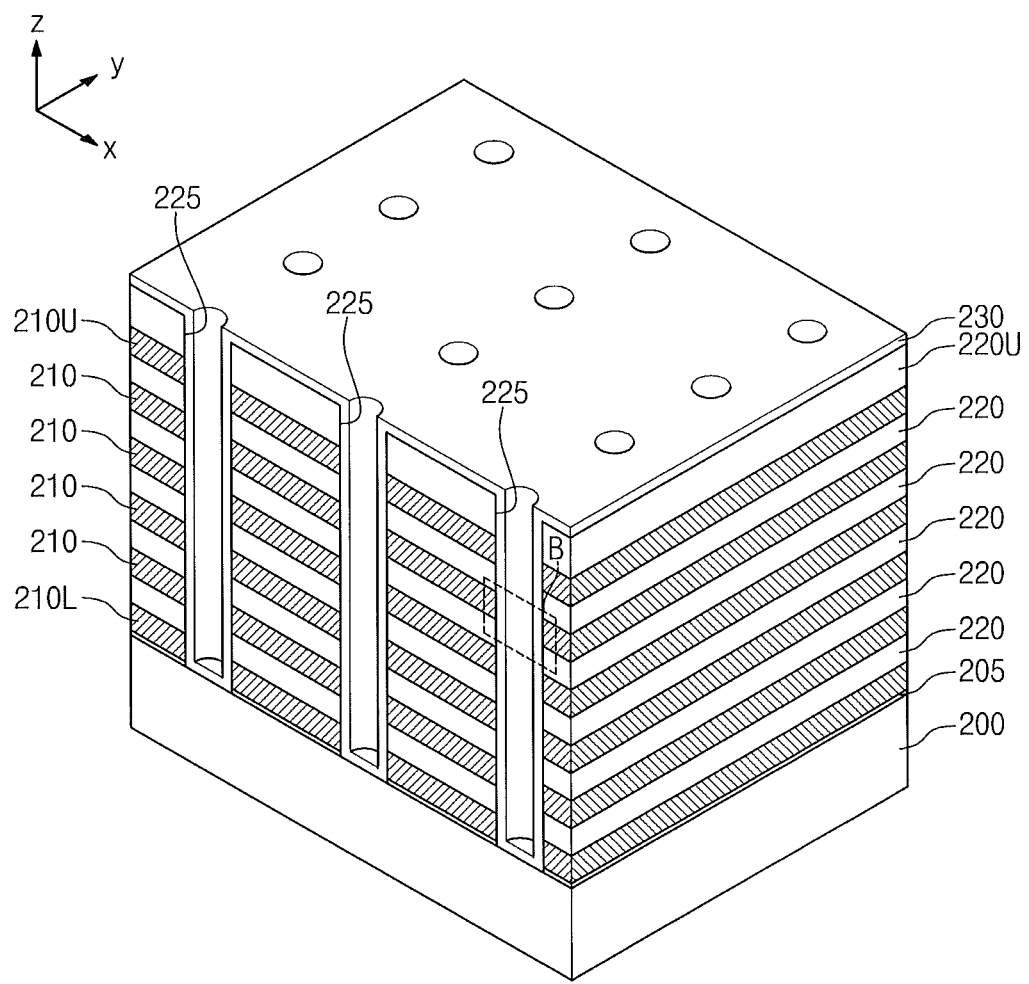

Referring to FIG. 6C, an information storage layer 230 may be formed covering a top surface of the uppermost insulating layer 220U, and a sidewall and a bottom of the channel opening 225. The information storage layer 230 may conformally cover a sidewall and a bottom of the channel openings 225. The information storage layer 230 may partially fill the channel opening 225.

Figure 7:
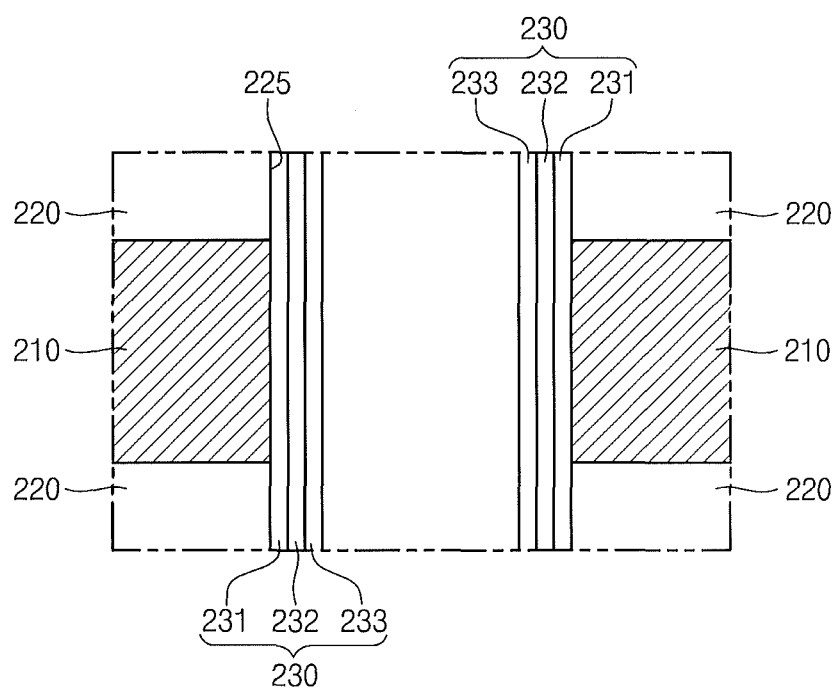
FIG. 7 is a detailed view of portion B of FIG. 6C for illustrating a method for fabricating an information storage layer included in a semiconductor device according to some embodiments.

FIG. 7 is a detailed view of portion B of FIG. 6C for illustrating an information storage layer included in a semiconductor device according to some embodiments.

Forming the information storage layer 230 may include sequentially forming a blocking layer 231, a charge storage layer 232, and a tunnel dielectric layer 233 covering the sidewall and bottom of the channel opening 225.

The blocking layer 231 may include at least one of a silicon oxide layer, a silicon nitride layer, a silicon oxynitride layer, and a high-k dielectric layer. The high-k dielectric layer may include at least one of a metal oxide layer, a metal nitride layer, and a metal oxynitride layer. The high-k dielectric layer may include hafnium (Hf), zirconium (Zr), aluminum (Al), tantalum (Ta), lanthanum (La), cerium (Ce), praseodymium (Pr), or the like. A dielectric constant of the blocking layer 231 may be higher than that of the tunnel dielectric layer 233.

The charge storage layer 232 may include charge trap sites, which can store charges. For example, the charge storage layer 232 may include at least one of a silicon nitride layer, a metal nitride layer, a metal oxynitride layer, a metal silicon oxide layer, a metal silicon oxynitride layer, and nanodots.

The tunnel dielectric layer 233 may have a single layer structure or a multilayer structure. For example, the tunnel dielectric layer 233 may include at least one of a silicon oxynitride layer, a silicon nitride layer, a silicon oxide layer, and a metal oxide layer.

Figure 6D:
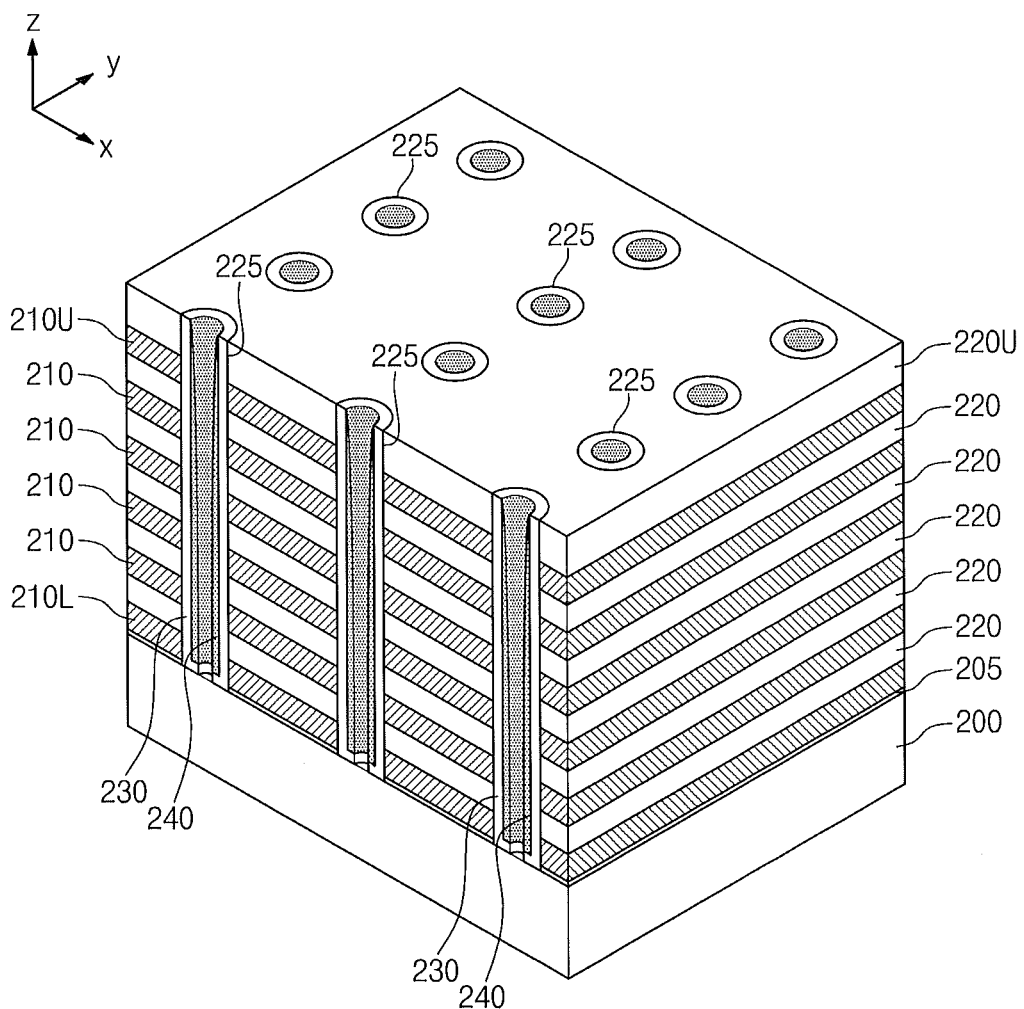

Referring to FIG. 6D, a spacer 240 may be formed in the channel opening 225. The spacer 240 may cover the information storage layer 230 covering the sidewall of the channel opening 225. The spacer 240 may be formed such that a portion of the information storage layer 230 covering the bottom surface of the channel opening 225 is exposed by the channel opening 225. Forming the spacer 240 may include forming a spacer layer on the substrate 200 and anisotropically etching the spacer layer. The spacer 240 may include amorphous or polycrystalline silicon.

The portion of the information storage layer 230 covering the bottom surface of the channel opening 225 may be etched by using the spacer 240 as an etch mask. As a result, the top surface of the substrate 200 may be exposed by the channel opening 225. While the portion of the information storage layer 230 covering the bottom surface of the channel opening 225 is etched, the portion of the information storage layer 230 disposed on the top surface of the uppermost insulating layer 220U may be etched, so that the top surface of the uppermost insulating layer 220U may be exposed.

Figure 6E:
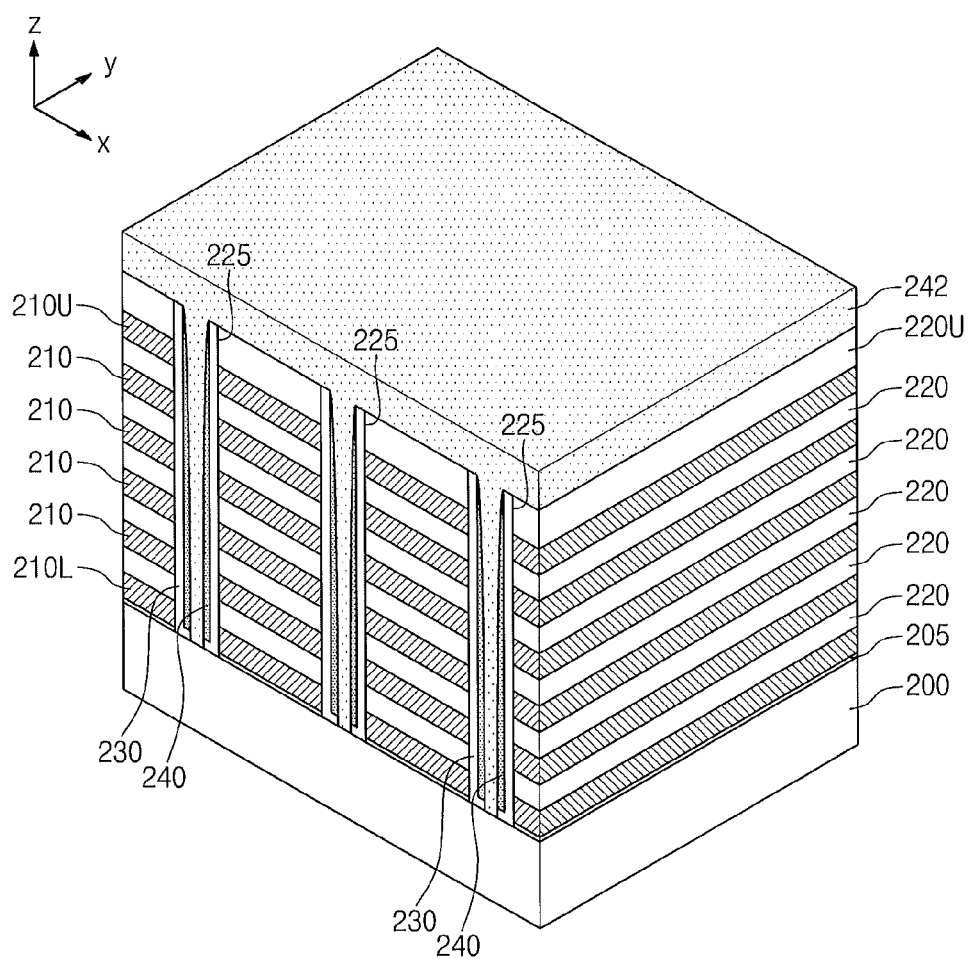

Referring to FIG. 6E, a semiconductor solution 242 may be formed in the channel openings 225. The semiconductor solution 242 may be formed by using a spin-on process. The semiconductor solution 242 may completely fill the channel openings 225. The semiconductor solution 242 may be formed so as to fully cover the top surface of the uppermost insulating layer 220U.

The semiconductor solution 242 may be in a liquid state including a semiconductor material and having a viscosity. For example, the semiconductor solution 242 may be in a state such that a dispersoid including a semiconductor material is dispersed in a liquid dispersion medium. The dispersoid may further include an additional element bonded to the semiconductor material. For example, the semiconductor solution 242 may include cyclopentasilane and toluene. The cyclopentasilane may correspond to the dispersoid including silicon, the toluene may correspond to the dispersion medium, and the hydrogen included in the cyclopentasilane may be the additional element. By forming the semiconductor solution 242 having the viscosity using the spin-on process, the channel openings 225 may be filled by the semiconductor solution 242 without any void and/or seam.

Figure 6F:
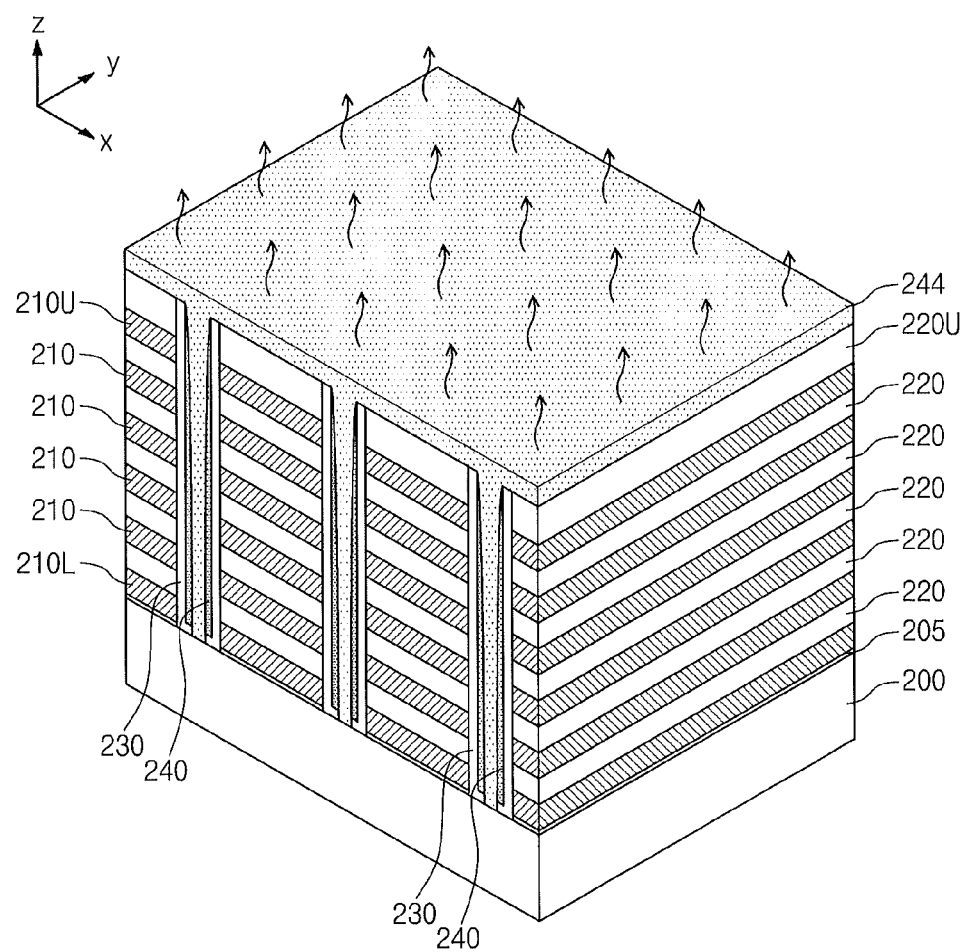

Referring to FIG. 6F, the semiconductor solution 242 may be thermally treated. By the thermal treatment, the semiconductor solution 242 may be changed to a solid semiconductor layer 244. The solid semiconductor layer 244 may contact the top surface of the substrate 200. For example, the solid semiconductor layer 244 may directly contact the top surface of the substrate 200. By the thermal treatment, the dispersion media in the semiconductor solution 242 may be vaporized. Additionally, by the thermal treatment, the additional element and the semiconductor material in the dispersoid may be separated from each other. The separated additional element may be vaporized. Resultantly, the semiconductor solution 242 may be changed to the solid semiconductor layer 244.

The semiconductor layer 244 may be in an amorphous state. The thermal treatment may include irradiating ultraviolet rays onto the semiconductor solution 242. As the dispersion media are vaporized, a distance from the top surface of the uppermost insulating layer 220U to a top surface of the semiconductor layer 244 may be less than a distance from the top surface of the uppermost insulating layer 220U to the top surface of the semiconductor solution 242. In other words, the thickness of the semiconductor layer 244 on the uppermost insulating layer 220U may be less than the thickness of the semiconductor solution 242 on the uppermost insulating layer 220U.

Figure 6G:
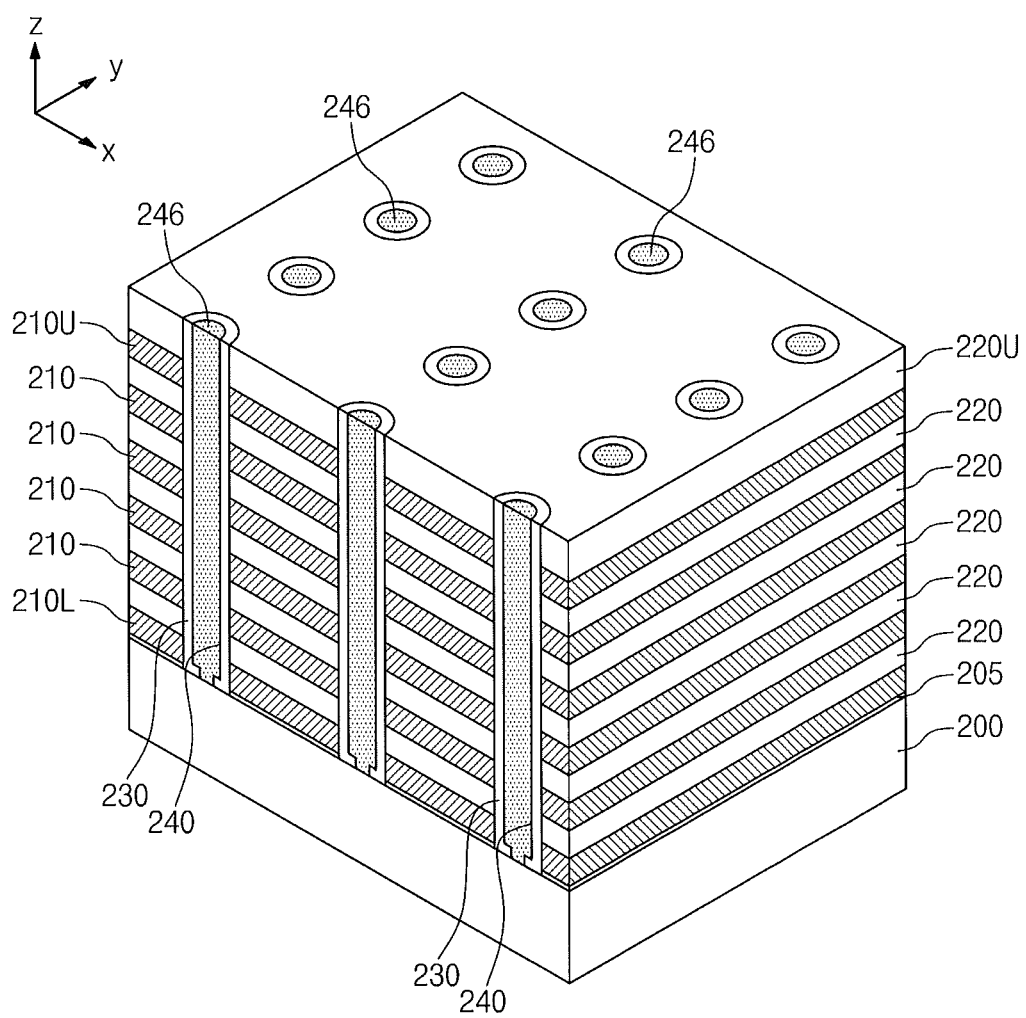

Referring to FIG. 6G, a planarizing process may be performed by using the uppermost insulating layer 220U as an etch stop layer. The planarizing process may be performed by an etch back or chemical mechanical polishing (CMP). By the planarizing process, the semiconductor layer 244 on the uppermost insulating layer 220U may be removed and the semiconductor layer 244 in the channel opening 225 may be maintained.

After the planarizing process, a process for crystallizing the semiconductor layer 244 and the spacer 240 may be performed. By the crystallizing process, the amorphous semiconductor layer 244 and the amorphous spacer 240 may be changed to a crystalline semiconductor pillar 246. The semiconductor pillar 246 may be in a single crystalline state and/or polycrystalline state. The crystallizing of the semiconductor layer 244 and the spacer 240 may include at least one of irradiating a laser beam to the semiconductor layer 244 and the spacer 240, or supplying heat to the semiconductor layer 244 and the spacer 240. The crystallizing process may have a process temperature which is higher than the process temperature of the thermal treatment.

Alternatively, the crystallizing process of the semiconductor layer 244 and the spacer 240 may be omitted. In such embodiments, after the semiconductor layer 244 on the uppermost insulating layer 220U is removed by the planarizing process, the semiconductor pillar 246 including the semiconductor layer 244 remaining in the channel opening 225 and the spacer 240 may be defined.

The semiconductor pillars 246 may be arranged in the first direction (i.e., x-axis direction) to form a single row, and the semiconductor pillars 246 may be arranged in the second direction (i.e., y-axis direction) to form a single column. A plurality of rows and a plurality of columns may be arranged on the substrate 200.

Figure 8:
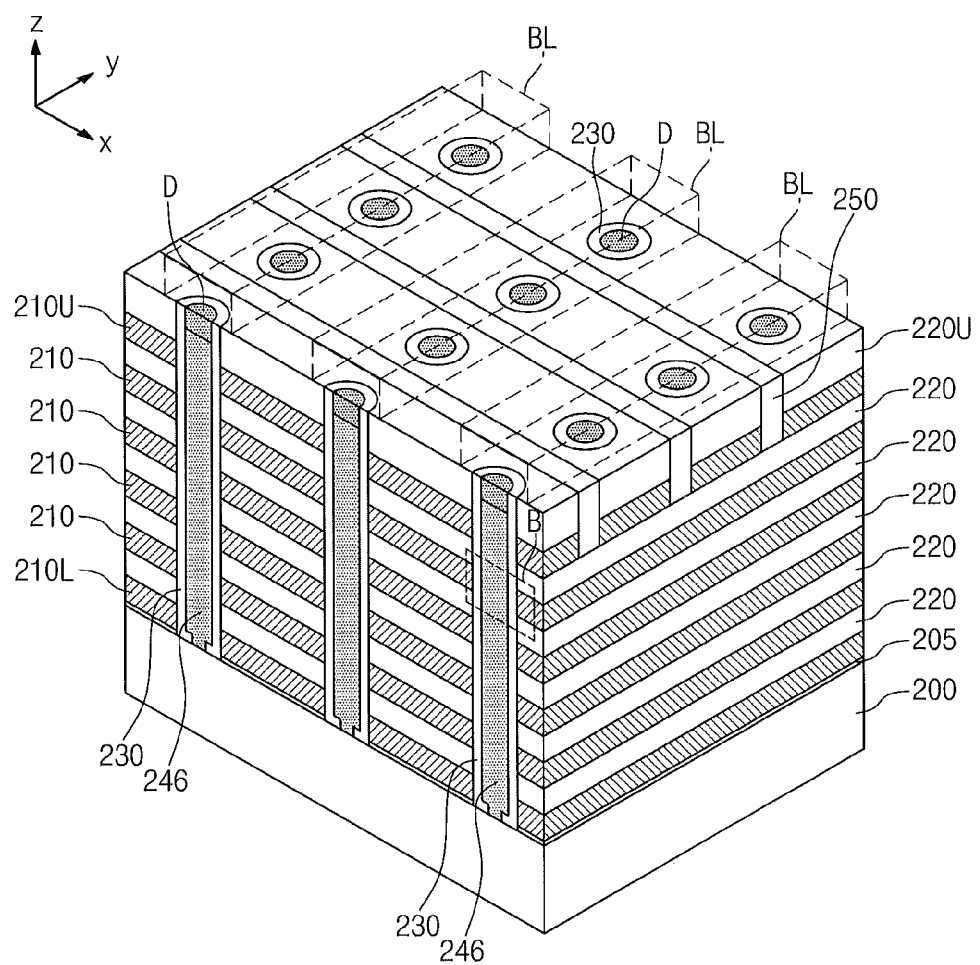
FIG. 8 is a perspective view for illustrating a semiconductor device according to some embodiments.

Referring to FIG. 8, a drain region D may be formed in an upper portion of the semiconductor pillar 246. The drain region D may be doped with the second type of dopants. The drain region D may be formed by providing the second type of dopants to the upper portion of the semiconductor pillar 246. A bottom surface of the drain region D may be at a higher level than the top surface of the uppermost gate electrode 210U. Alternatively, the bottom surface of the drain region D may be at a similar level to the top surface of the uppermost gate electrode 210L.

An isolation pattern 250 may be formed between the columns of adjacent ones of the semiconductor pillars 246. The isolation pattern 250 may be formed on the insulating layer 220 directly below the uppermost insulating layer 210U.

A bit line electrically connected to the drain region D may be formed. The bit line may extend in the first direction (i.e., x-axis direction). The bit line BL may be formed directly on the uppermost insulating pattern 220U and the isolation pattern 250. Alternatively, after forming an interlayer dielectric layer covering the uppermost insulating pattern 220U and the isolation pattern 250, the bit line BL may be formed on the interlayer dielectric layer. In such embodiments, the bit line BL may electrically contact the drain region D via a contact plug penetrating the interlayer dielectric layer.

FIG. 8 is a perspective view for illustrating a semiconductor device according to some embodiments.

Referring to FIG. 8, a substrate 200 may be prepared. The substrate 200 may be a semiconductor substrate. The substrate 200 may be a silicon substrate, a germanium substrate, a silicon-germanium substrate, a compound semiconductor substrate, or the like. The substrate 200 may be doped with the first type of dopants.

Gate electrodes 210L, 210, and 210U and insulating patterns 220 and 220U may be alternatingly stacked on the substrate 200. The gate electrodes 210L and 210 (but not the uppermost gate electrode 210U) and the insulating layers 220 (but not the uppermost insulating layer 220U) may each have a plate shape extending in a first direction (i.e., x-axis direction) and a second direction (i.e., y-axis direction) on the substrate 200. The uppermost insulating layer 220U and the uppermost gate electrode 210U may have a line shape extending in the first direction (i.e., x-axis direction). A plurality of the uppermost insulating layers 220U and the uppermost gate electrodes 210U shaped in a line extending in the first direction (i.e., x-axis direction) may be provided on the substrate.

An isolation pattern 250 may be provided between the uppermost insulating layer 220U and the uppermost gate electrode 210U shaped in a line extending in the first direction (i.e., x-axis direction). The uppermost gate electrodes 210U, which may be adjacent each other and shaped in a line extending in the first direction (i.e., x-axis direction), may be electrically isolated from each other. The isolation pattern 250 may be disposed on the insulating layer 220 and directly below the uppermost gate electrode 210U. The isolation pattern 250 may extend in the first direction (i.e., x-axis direction) along the uppermost insulating layer 220U and the uppermost gate electrode 210U. The isolation pattern 250 may include an insulating material. For example, the isolation pattern 250 may include a silicon oxide.

The insulating layers 220 and 220U may include an oxide. For example, the insulating layers 220 and 220U may include a silicon oxide. The gate electrodes 210L, 210, and 210U may include a conductive material. For example, the gate electrodes 210L, 210, and 210U may include at least one of metals (e.g., tungsten (W), aluminum (Al), titanium (Ti), tantalum (Ta), etc.), conductive metal nitrides (e.g., titanium nitride, tantalum nitride, etc.), or doped semiconductor materials (e.g., doped silicon, doped germanium, doped silicon germanium, etc.).

A semiconductor pillar 246 may be provided penetrating the gate electrodes 210L, 210, and 210U and the insulating layers 220 and 220U, which are alternatingly and repeatedly stacked. The semiconductor pillar 246 may penetrate the uppermost insulating layer 220U and the uppermost gate electrode 210U. The semiconductor pillar 246 may extend in a third direction (i.e., z-axis direction) vertical/perpendicular to the first direction and the second direction. The third direction (i.e., z-axis direction) may be a direction vertical/perpendicular to the top surface of the substrate 200. One end of the semiconductor pillar 246 may contact the top surface of the substrate 200. For example, the end of the semiconductor pillar 246 may directly contact the top surface of the substrate 200. A drain region D may be formed in an upper portion of the semiconductor pillar 246. The drain region D may be a region doped with the second type of dopants. The semiconductor pillar 246 may be a single crystalline or polycrystalline semiconductor.

A plurality of the semiconductor pillars 246 may be provided on the substrate 200. The plurality of semiconductor pillars 246 may be arranged two-dimensionally in the first direction and the second direction. The isolation pattern 250 may be provided between the semiconductor pillars 246 arranged in the second direction (i.e., y-axis direction).

Each of the semiconductor pillars 246, the gate electrodes 210L, 210, and 210U surrounding each of the semiconductor pillars 246, and an information storage layer 230 disposed between each of the semiconductor pillars 246 and the gate electrodes 210L, 210, and 210U, may be included in a single vertical cell string. The vertical cell string may include a lower select transistor, a plurality of memory cells, and an upper select transistor, which may be connected in series to one another and may be stacked. Among the gate electrodes 210L, 210, and 210U, the lowermost gate electrode 210L may correspond to a gate of the lower select transistor, and the uppermost gate electrode 210U may correspond to a gate of the upper select transistor. The gate electrodes 210 between the lowermost gate electrode 210L and the uppermost gate electrode 210U may correspond to gates of the memory cells.

The substrate 200 may include a common source region disposed below a top surface thereof. The common source region may have a plate shape. The common source region may be a region doped with the second type of dopants. The lowermost gate electrodes 210L may control an electrical connection between the common source region and the semiconductor pillar 246.

A bit line BL may be electrically connected to the drain region D. The uppermost gate electrodes 210U may control an electrical connection between the bit line BL and the vertical cell string. The bit line BL may extend in the second direction (i.e., y-axis direction). As such, the bit line BL may cross the uppermost gate electrodes 210U. A plurality of the bit lines BL may be disposed on the substrate 200. The plurality of bit lines BL may be parallel to one another. One bit line BL may be electrically connected to the plurality of drain regions D, which may be respectively formed in the plurality of semiconductor pillars 246 constituting a single row arranged in the second direction (i.e., y-axis direction). The bit line BL may be directly connected to the drain region D. Alternatively, the bit line BL may be disposed on an interlayer dielectric layer that is disposed on the uppermost insulating pattern 220U and the isolation pattern 250. In such embodiments, the bit line BL may electrically contact the drain region D via a contact plug penetrating the interlayer dielectric layer.

The information storage layer 230 positioned between the gate electrodes 210 and the semiconductor pillar 246 may correspond to a data storage element of the memory cell. The information storage layer 230 between the lowermost gate electrode 210L and the semiconductor pillar 246 may be included in a gate dielectric layer of the lower select transistor, and the information storage layer 230 between the uppermost gate electrode 210U and the semiconductor pillar 246 may be included in a gate dielectric layer of the upper select transistor.

The information storage layer 230 may include a tunnel dielectric layer (233 of FIG. 7) contacting the semiconductor pillar 246, a charge storage layer (232 of FIG. 7) disposed between the tunnel dielectric layer (233 of FIG. 7) and the gate electrode 210, and a blocking layer (231 of FIG. 7) disposed between the charge storage layer (232 of FIG. 7) and the gate electrode 210.

The semiconductor devices according to some embodiments may be mounted in various types of packages. Examples of the packages of the semiconductor devices according to some embodiments may include package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline package (SOP), a shrink small outline package (SSOP), a thin small outline package (TSOP), a thin quad flat package (TQFP), a system in package (SIP), a multi chip package (MCP), a wafer-level fabricated package (WFP), a wafer-level processed package (WSP), and the like. The packages equipped with the semiconductor devices according to some embodiments may further include a controller for controlling the semiconductor device, and/or a logic device.

Figure 9:
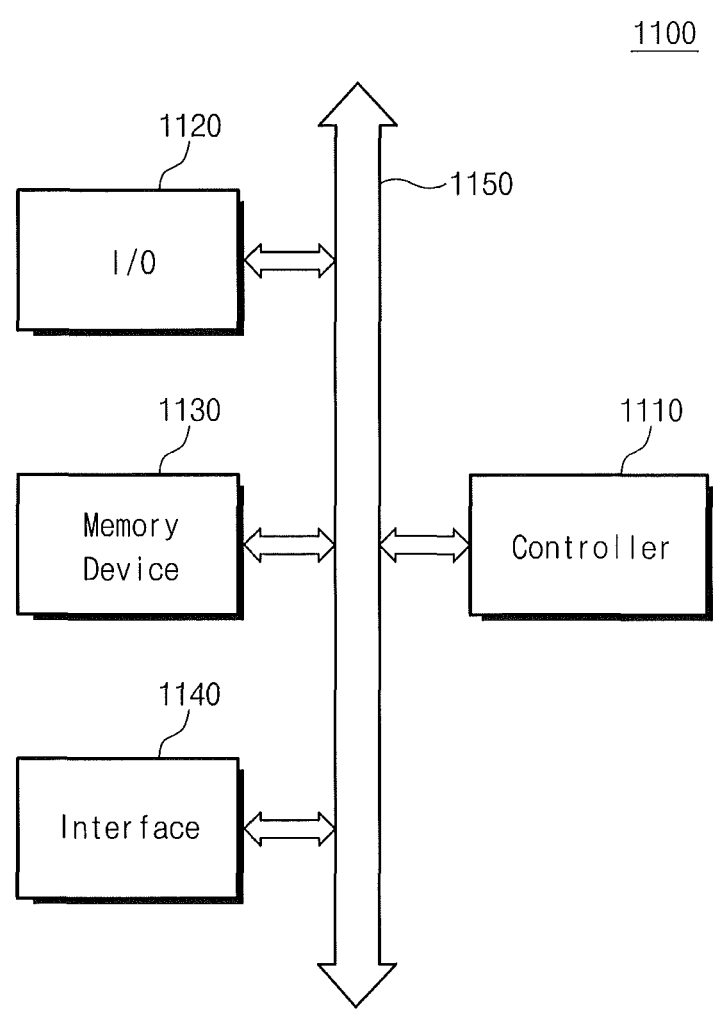
FIG. 9 is a block diagram for illustrating an electronic system including a semiconductor device according to some embodiments.

FIG. 9 is a block diagram for illustrating an electronic system including a semiconductor device according to some embodiments.

Referring to FIG. 9, an electronic system 1100 according to some embodiments includes a controller 1110, an input/output device (I/O) 1120, a memory device 1130, an interface 1140, and a bus 1150. The controller 1110, the input/output device 1120, the memory device 1130, and/or the interface 1140 may be coupled to one another through the bus 1150. The bus 1150 may correspond to a path through which data is moved.

The controller 1110 may include at least one of a microprocessor, a digital signal processor, a microcontroller, and logic devices capable of performing similar functions to the above elements. The input/output device 1120 may include a keypad, a keyboard, a display device, and the like. The memory device 1130 may store data and/or commands. The memory device 1130 may include at least one of the semiconductor memory devices disclosed in some embodiments. Also, the memory device 1130 may further include other types of semiconductor devices (e.g., DRAM device and/or SRAM device). The interface 1140 may serve to transmit/receive data to/from a communication network. The interface 1140 may include a wired and/or wireless interface. For example, the interface 1140 may include an antenna and/or a wired/wireless transceiver. Although not shown in the drawings, the electronic system 1100 may further include a high speed DRAM and/or SRAM as a working memory for enhancing operations of the controller 1110.

The electronic system 1100 may be applied to a personal digital assistant (PDA), a portable computer, a web tablet, a wireless phone, a mobile phone, a digital music player, a memory card, or any of the numerous electronic products capable of transmitting/receiving information in a wireless environment.

Figure 10:
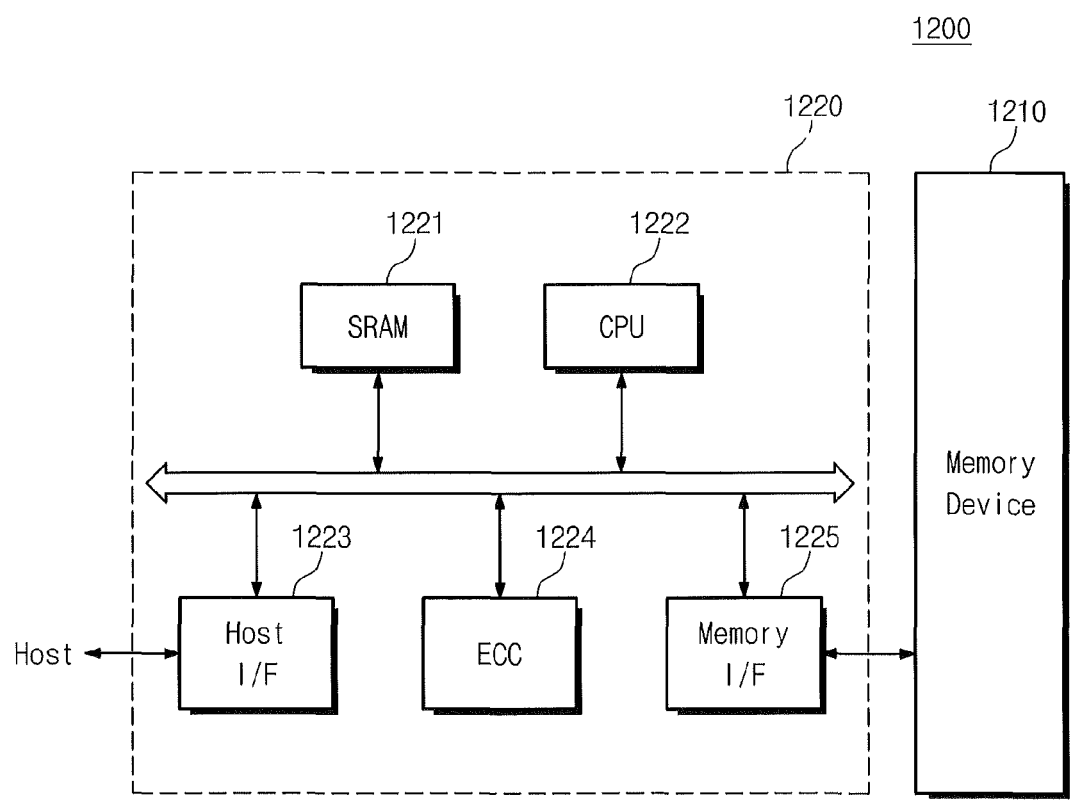
FIG. 10 is a block diagram of a memory card including a semiconductor device according to some embodiments.

FIG. 10 is a block diagram of a memory card including a semiconductor device according to the technical spirit of some embodiments.

Referring to FIG. 10, a memory card 1200 according to some embodiments includes a memory device 1210. The memory device 1210 may include at least one of the semiconductor memory devices disclosed in some embodiments. Also, the memory device 1210 may further include other types of semiconductor memory devices (e.g., DRAM device and/or SRAM device). The memory card 1200 may include a memory controller 1220 for controlling data exchanges between a host and the memory device 1210.

The memory controller 1220 may include a processing unit (CPU) 1222 controlling an overall operation of the memory card 1200. Also, the memory controller 1220 may include an SRAM 1221 that may be used as a working memory of the processing unit 1222. The memory controller 1220 may further include a host interface 1223 and a memory interface 1225. The host interface 1223 may be provided with a data exchange protocol between the memory card 1200 and the host. The memory interface 1225 may connect the memory controller 1220 and the memory device 1210. Furthermore, the memory controller 1220 may further include an error correction block (ECC) 1224. The ECC 1224 may detect and correct an error of data read from the memory device 1210. Although not shown in FIG. 10, the memory card 1200 may further include a ROM device storing code data for interfacing with the host. The memory card 1200 may be used as a portable data storage card. Alternatively, the memory card 1200 may be provided in the form of a solid state disk (SSD), which may be capable of substituting for a hard disk of a computer system.

According to some embodiments, first material layers and second material layers which are alternatingly and repeatedly stacked, and an opening penetrating the first and second material layers, may be provided. Because the opening may be stably filled with a semiconductor solution using a spin-on process, a semiconductor device with excellent reliability can be realized.

The above-disclosed subject matter is to be considered illustrative and not restrictive, and the appended claims are intended to cover all such modifications, enhancements, and other embodiments, which fall within the spirit and scope of the disclosure. Thus, to the maximum extent allowed by law, the scope of the disclosure is to be determined by the broadest permissible interpretation of the following claims and their equivalents, and shall not be restricted or limited by the foregoing detailed description.

What is claimed is:

1. A method for fabricating a semiconductor device, comprising:
    stacking first material layers and second material layers on a substrate to form a stack within which the first material layers and the second material layers repeatedly alternate;
    forming an opening penetrating the first material layers and the second material layers;
    forming a semiconductor solution in the opening by using a spin-on process;
    thermally treating the semiconductor solution; and
    after the thermal treatment of the semiconductor solution,
        forming a trench exposing sidewalls of the first and second material layers;
        removing the first material layers to form recess regions;
        forming an information storage layer in each of the recess regions; and
        forming gates filling the recess regions.

2. The method of claim 1, wherein the opening exposes a surface of the substrate, and wherein the thermal treatment changes the semiconductor solution to a solid semiconductor layer contacting the surface of the substrate.

3. The method of claim 2, wherein the solid semiconductor layer is in an amorphous state, and the method further comprises crystallizing the solid semiconductor layer.

4. The method of claim 3, wherein crystallizing the solid semiconductor layer comprises at least one of irradiating a laser beam to the solid semiconductor layer or supplying heat to the solid semiconductor layer, and wherein a process temperature for crystallizing the solid semiconductor layer is higher than a process temperature for the thermal treatment of the semiconductor solution.

5. The method of claim 1, further comprising, before forming the semiconductor solution, forming an auxiliary semiconductor layer at least partially filling the opening.

6. The method of claim 5, wherein a volume occupied by the auxiliary semiconductor layer in the opening is less than a volume occupied by the semiconductor solution in the opening.

7. The method of claim 5, wherein the semiconductor solution is changed to a solid semiconductor layer by the thermal treatment, wherein the solid semiconductor layer and the auxiliary semiconductor layer are in an amorphous state, and wherein the method further comprises, after the thermal treatment of the semiconductor solution, crystallizing the auxiliary semiconductor layer and the solid semiconductor layer.

8. The method of claim 5, wherein the auxiliary semiconductor layer is conformally formed along a sidewall of the opening and a portion of the opening that is adjacent a surface of the substrate, and wherein the auxiliary semiconductor layer has a thickness less than half of a width of the opening.

9. The method of claim 5, wherein forming the auxiliary semiconductor layer comprises:
    forming a preliminary auxiliary semiconductor layer in the opening such that the preliminary auxiliary semiconductor layer has a thickness equal to or greater than half of a width of the opening; and
    recessing the preliminary auxiliary semiconductor layer to form the auxiliary semiconductor layer such that the auxiliary semiconductor layer only partially fills the opening.

10. The method of claim 9, wherein a portion of the preliminary auxiliary semiconductor layer includes a void.

11. The method of claim 10, wherein the auxiliary semiconductor layer is free of the void.

12. A method for fabricating a semiconductor device, comprising:
    stacking first material layers and second material layers on a substrate to form a stack within which the first material layers and the second material layers repeatedly alternate;
    forming an opening penetrating the first material layers and the second material layers;
    forming a semiconductor solution in the opening by using a spin-on process; and
    thermally treating the semiconductor solution, wherein the first material layers include a conductive material and the second material layers include an insulating material.

13. The method of claim 12 further comprising, before forming the semiconductor solution, forming an information storage layer in the opening.

14. The method of claim 1, wherein the semiconductor solution comprises cyclopentasilane and toluene.

15. The method of claim 1, wherein forming the semiconductor solution includes filling the opening with the semiconductor solution such that the semiconductor solution covers the first material layers and covers an uppermost one of the second material layers that covers the first material layers.

16. The method of claim 15, wherein the thermal treatment changes the semiconductor solution filling the opening and covering the uppermost material layer to a solid semiconductor layer, and the method further comprises, after the thermal treatment of the semiconductor solution, planarizing the solid semiconductor layer using the uppermost material layer as an etch stop layer to expose a surface of the uppermost material layer and confine the solid semiconductor layer to the opening.

17. The method of claim 1, wherein the first material layers are formed on a buffer dielectric layer such that the buffer dielectric layer is between the first material layers and the substrate.

18. The method of claim 12, further comprising, before forming the semiconductor solution, forming a spacer in the opening.

19. A method for fabricating a semiconductor device, comprising:

stacking first material layers and second material layers on a substrate to form a stack within which the first material layers and the second material layers repeatedly alternate;

forming an opening penetrating the first material layers and the second material layers;

forming a semiconductor solution in the opening by using a spin-on process;

thermally treating the semiconductor solution to change the semiconductor solution to a solid semiconductor layer;

after the thermal treatment of the semiconductor solution,
 forming a trench exposing sidewalls of the first and second material layers;
 removing the first material layers to form recess regions;
 forming an information storage layer in each of the recess regions; and
 forming gates filling the recess regions; and planarizing the solid semiconductor layer to confine the solid semiconductor layer to the opening.

* * * * *